(12) United States Patent
Lu

(10) Patent No.: US 10,692,804 B2
(45) Date of Patent: Jun. 23, 2020

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/998,409

(22) Filed: Aug. 15, 2018

(65) Prior Publication Data

US 2020/0058579 A1    Feb. 20, 2020

(51) Int. Cl.
| | |
|---|---|
| *H01L 23/498* | (2006.01) |
| *H01L 23/00* | (2006.01) |
| *H01L 23/538* | (2006.01) |
| *H01L 21/48* | (2006.01) |

(52) U.S. Cl.
CPC ...... *H01L 23/49838* (2013.01); *H01L 21/486* (2013.01); *H01L 23/5386* (2013.01); *H01L 24/09* (2013.01); *H01L 2224/02331* (2013.01); *H01L 2224/02372* (2013.01)

(58) Field of Classification Search
CPC . H01L 25/0652; H01L 25/0657; H01L 24/97; H01L 2224/97; H01L 2225/1041; H01L 2225/107
See application file for complete search history.

(56) References Cited

U.S. PATENT DOCUMENTS

| | | | | | |
|---|---|---|---|---|---|
| 5,153,700 | A | * | 10/1992 | Ohara | H01L 23/13 257/625 |
| 6,750,397 | B2 | * | 6/2004 | Ou | H01L 23/36 174/524 |
| 8,927,339 | B2 | * | 1/2015 | Lin | H01L 21/4878 438/118 |
| 9,478,500 | B2 | | 10/2016 | Chen et al. | |
| 9,818,683 | B2 | | 11/2017 | Chiang et al. | |
| 2012/0104623 | A1 | | 5/2012 | Pagaila et al. | |
| 2017/0207208 | A1 | | 7/2017 | Chen et al. | |
| 2018/0331082 | A1 | * | 11/2018 | Then | H01L 25/16 |

\* cited by examiner

*Primary Examiner* — Sonya D. McCall-Shepard
(74) *Attorney, Agent, or Firm* — Foley & Lardner LLP

(57) ABSTRACT

A semiconductor device package includes an interposer and a semiconductor device. The interposer has a sidewall defining a space. The semiconductor device is disposed within the space and in contact with the sidewall. An interposer includes a first surface, a second surface and a third surface. The first surface has a first crystal orientation. The second surface is opposite the first surface and has the first crystal orientation. The third surface connects the first surface to the second surface, and defines a space. An angle defined by the third surface and the first surface ranges from about 90° to about 120°.

19 Claims, 37 Drawing Sheets

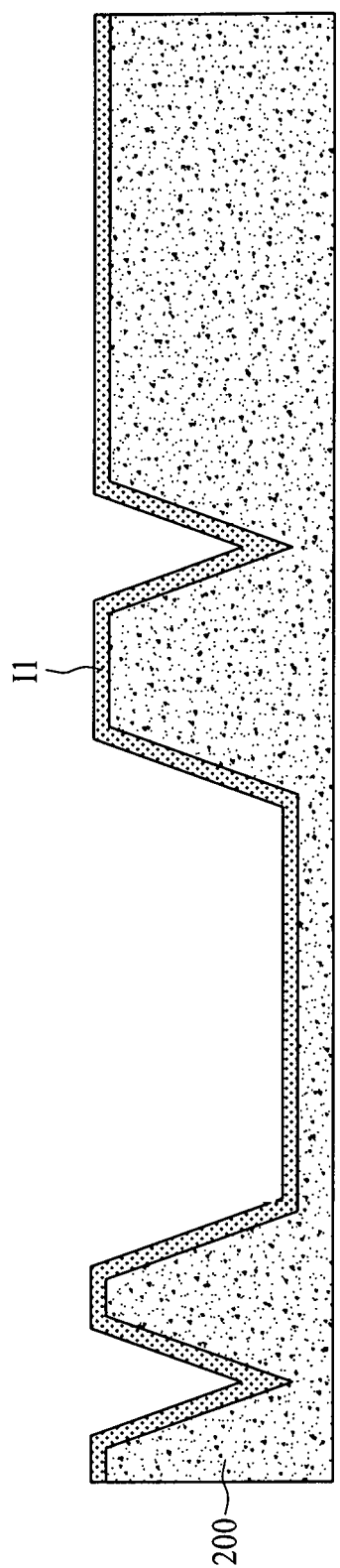

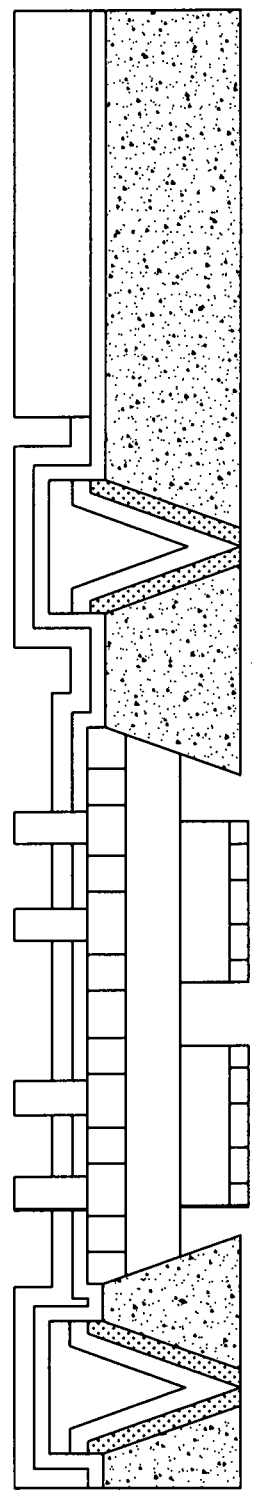

SEMICONDUCTOR DEVICE PACKAGE AND METHOD OF MANUFACTURING THE SAME

BACKGROUND

1. Technical Field

The subject application relates generally to a semiconductor device package, and more particularly, the subject application relates to a semiconductor device package including an interposer.

2. Description of the Related Art

A semiconductor device package may include an interposer between a semiconductor device and a substrate. The interposer spreads a connection from a relatively smaller pitch to a relatively wider pitch or reroutes a connection to a different connection. As technology advances, the interposer should shrink to meet the trend for miniaturization. Handling issue(s) may arise with a relatively thin interposer. In order to achieve miniaturization of the semiconductor device package, a space or cavity may be formed in an interposer to accommodate semiconductor device(s) or other component(s). However, misalignment(s) may occur during manufacturing, which will adversely affect the performance of the semiconductor device package.

SUMMARY

In one aspect, according to some embodiments, a semiconductor device package includes an interposer and a semiconductor device. The interposer has a sidewall defining a space. The semiconductor device is disposed within the space and in contact with the sidewall.

In another aspect, according to some embodiments, an interposer includes a first surface, a second surface, and a third surface. The first surface has a first crystal orientation. The second surface is opposite the first surface and has the first crystal orientation. The third surface connects the first surface to the second surface, and defines a space. An angle defined by the third surface and the first surface ranges from about 90° to about 120°.

In yet another aspect, according to some embodiments, a method of manufacturing a semiconductor device package includes anisotropically removing a portion of a carrier to form a space, and disposing a semiconductor device in the space and in contact with the carrier.

BRIEF DESCRIPTION OF THE DRAWINGS

Aspects of the subject application are best understood from the following detailed description when read with the accompanying drawings. It is noted that various features may not be drawn to scale, and the dimensions of the depicted features in the drawings may be arbitrarily increased or reduced for clarity of discussion.

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N, FIG. 2O, FIG. 2P, FIG. 2Q, FIG. 2R, FIG. 2S, FIG. 2T, FIG. 2U, FIG. 2V, FIG. 2W, FIG. 2X, FIG. 2Y, FIG. 2Z, FIG. 2AA, FIG. 2BB, FIG. 2CC, FIG. 2DD, FIG. 2EE and FIG. 2FF show operations of manufacturing a semiconductor device package in accordance with some embodiments of the subject application.

Common reference numerals are used throughout the drawings and the detailed description to indicate the same or similar elements. The subject application will be more readily understood from the following detailed description taken in conjunction with the accompanying drawings.

DETAILED DESCRIPTION

To realize a compact semiconductor device package, a space or cavity may be formed in an interposer to accommodate an electronic component. However, during the process of placing the electronic component within the space or cavity, which may include a pick-and-place operation, a misalignment or offset may occur between the electronic component and the interposer due to the limited precision of the equipment or machine involved in the pick-and-place operation. The risk of the misalignment or offset may further limit the design of interconnection structure(s) between another structure and the electronic component or the interposer, and may adversely affect the yield performance when manufacturing the semiconductor device package.

In some embodiments of the subject application, by providing an interposer having a slanted sidewall to receive a semiconductor device (e.g. semiconductor die) having a guide structure (e.g. a slanted sidewall) to fit/match (or engage with) the slanted sidewall of the interposer, a moderately better alignment is achieved. Moreover, such arrangement also provides a relatively reinforced structure (e.g. relatively strong engagement/bonding between the interposer and the semiconductor device, wherein stress such as warpage stress can be mitigated by a discontinuous structure, etc.).

Figure 1A:
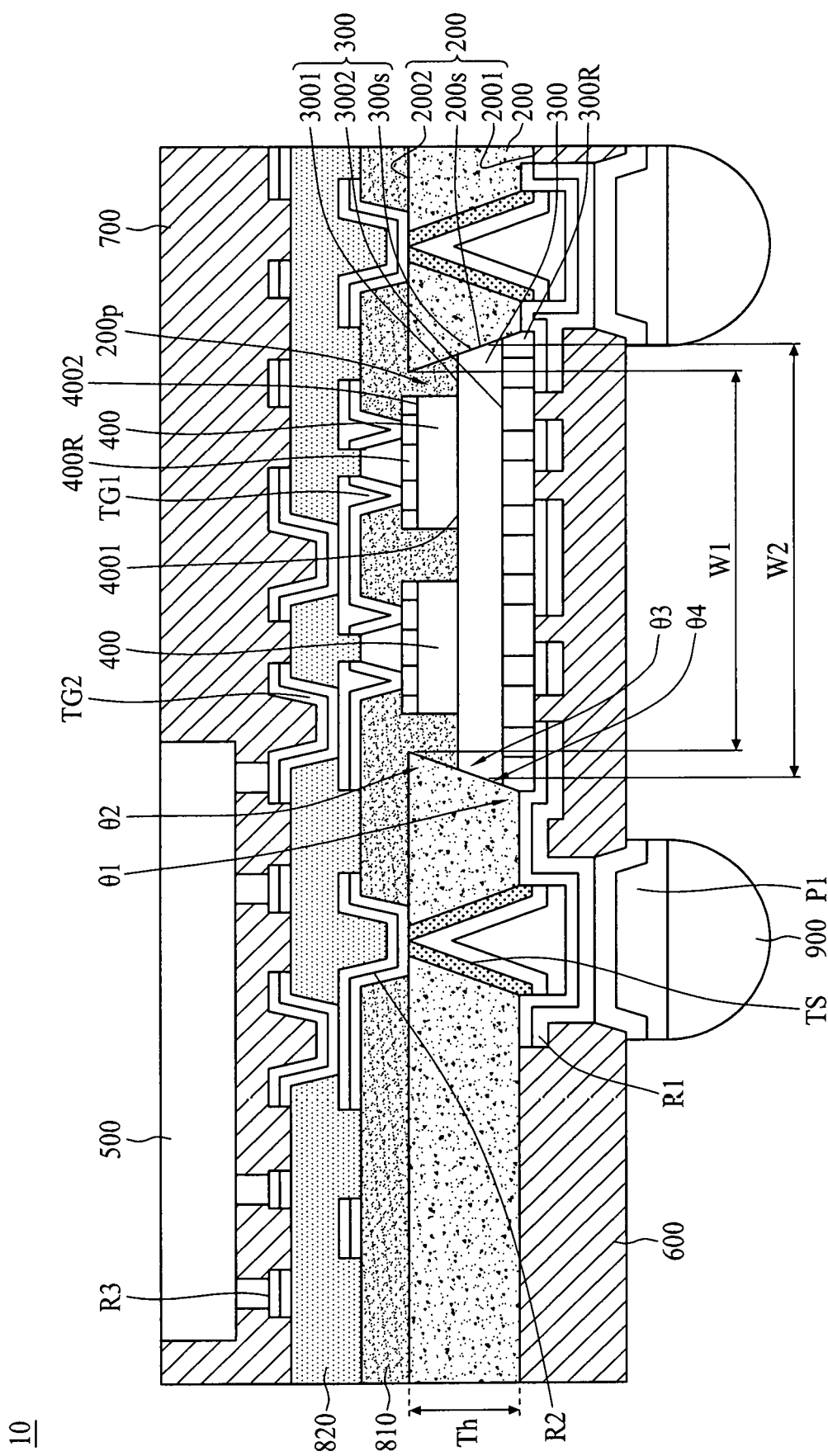
FIG. 1A illustrates a cross-sectional view of a semiconductor device package in accordance with some embodiments of the subject application.

FIG. 1A illustrates a cross-sectional view of a semiconductor device package 10 in accordance with some embodiments of the subject application. The semiconductor device package 10 includes an interposer or carrier 200, semiconductor devices 300, 400 and 500, protection layers 600 and 700, dielectric layers 810 and 820, connection elements 900, and redistribution layers (RDL) R1, R2 and R3. The semiconductor device package 10 may be part of or include a 2.5 dimensional (2.5D) or a 3 dimensional (3D) structure.

The interposer 200 has a surface 2001 (e.g. a lower surface). The interposer 200 has a surface 2002 (e.g. an upper surface) opposite the surface 2001. The interposer 200 has a sidewall or a side surface 200s connecting the surface 2001 to the surface 2002. The sidewall 200s is inclined or slanted with respect to the surface 2001. The sidewall 200s is inclined or slanted with respect to the surface 2002. The sidewall 200s and the surface 2001 define an angle θ1 which is greater than approximately 90°. The sidewall 200s and the surface 2001 define an angle θ1 which ranges from about 90° to about 120°. The sidewall 200s and the surface 2002 define an angle θ2 which is less than approximately 90°. The sidewall 200s and the surface 2002 define an angle θ2 which ranges from about 60° to about 90°. The surface 2001 and the surface 2002 have a similar or the same crystal orientation. A crystal orientation in the vicinity of the surface 2001 is similar or the same as a crystal orientation in the vicinity of the surface 2002. A crystal orientation adjacent to the surface 2001 is similar or the same as a crystal orientation adjacent to the surface 2002. The surface 2001 has a crystal orientation (or a lattice distribution) that includes a {1,1,0} or {1,1,1} crystal orientation. The surface 2002 has a crystal orientation (or a lattice distribution) that includes a {1,1,0} or {1,1,1} crystal orientation. The interposer 200 may have a crystal orientation (or a lattice distribution) that includes a {1,1,0} or {1,1,1} crystal orientation.

The interposer 200 may include, for example, a printed circuit board, such as a paper-based copper foil laminate, a composite copper foil laminate, or a polymer-impregnated glass-fiber-based copper foil laminate. The interposer 200 may include, for example but not limited to, silicon (Si), glass or other suitable material. The interposer 200 may include, for example but not limited to, a circuit. The interposer 200 may include, for example but not limited to, a redistribution layer structure.

The sidewall 200s is tapered from the surface 2001 toward the surface 2002. The sidewall 200s defines a conic, cone-like, or tapered space (or a cavity or gap) 200p. The sidewall 200s defines a conic, cone-like, or tapered through hole penetrating the interposer 200. The sidewall 200s defines a space 200p having various widths, for example, the space 200p has a width W1 and a width W2 greater than W1. The space 200p may be formed by, for example but not limited to, an etching technique. The space 200p may be formed by, for example but not limited to, a wet etching technique.

The semiconductor device 300 has a surface 3001. The semiconductor device 300 has a surface 3002 opposite the surface 3001. The semiconductor device 300 has a sidewall or a side surface 300s connecting the surface 3001 to the surface 3002. The surface 3001 may include an inactive surface. The surface 3002 may include an active surface. The surface 3002 may include an electrical circuit. The sidewall 300s is inclined or slanted with respect to the surface 3001. The sidewall 300s is inclined or slanted with respect to the surface 3002. The sidewall 300s and the surface 3001 define an angle θ3 which is greater than approximately 90°. The sidewall 300s and the surface 3002 define an angle θ4 which is less than approximately 90°. The angle θ3 defined by the sidewall 300s and the surface 3001 of the semiconductor device 300 may be substantially the same as the angle θ1 defined by the sidewall 200s and the surface 2001 of the interposer 200. The angle θ4 defined by the sidewall 300s and the surface 3002 of the semiconductor device 300 may be substantially the same as the angle θ2 defined by the sidewall 200s and the surface 2002 of the interposer 200. The sidewall 300s of the semiconductor device 300 may be substantially in parallel to the sidewall 200s of the interposer 200.

The semiconductor device 300 is disposed within the space 200p. The sidewall 300s is in contact with the sidewall 200s of the interposer 200. The whole sidewall 300s may be in contact with the sidewall 200s. In some other embodiments, a selected portion or a selected end of the sidewall 300s is in contact with the sidewall 200s. In some other embodiments, a selected corner of the semiconductor device 300 is in contact with the sidewall 200s. The semiconductor device 300 may be partially surrounded by the interposer 200. The semiconductor device 300 may be fully surrounded by the interposer 200. The semiconductor device 300 has a width or a size substantially the same as a width or a size of the space 200p. The semiconductor device 300 is fixed in the space 200p by engaging the sidewall 300s with the sidewall 200s of the interposer 200.

The semiconductor device 300 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof.

The semiconductor device 400 has a surface 4001. The semiconductor device 400 has a surface 4002 opposite the surface 4001. The surface 4001 may include an inactive surface. The surface 4002 may include an active surface. The surface 4002 may include an electrical circuit. The semiconductor device 400 may have similar or the same properties as those of the semiconductor device 300.

The semiconductor device 400 is disposed within the space 200p. The semiconductor device 400 is disposed on the semiconductor device 300. The semiconductor device 400 is separated from the interposer 200 in FIG. 1A. In some other embodiments, the semiconductor device 400 may be in contact with the sidewall 200s of the interposer 200. The semiconductor device 400 may be partially surrounded by the interposer 200. The semiconductor device 400 may be fully surrounded by the interposer 200. The surface 4001 of the semiconductor device 400 may be adjacent to the surface 3001 of the semiconductor device 300. The surface 4001 of the semiconductor device 400 may be in contact with the surface 3001 of the semiconductor device 300. In the embodiment shown in FIG. 1A, an area of the semiconductor device 300 is greater than an area of the semiconductor device 400. The combination of the semiconductor device 300 and the semiconductor device 400 may be fully within the space 200p. The combination of the semiconductor device 300 and the semiconductor device 400 may be fully surrounded by the interposer 200. The interposer 200 may have a thickness Th equal to or greater than a sum of a thickness of the semiconductor device 300 and a thickness of the semiconductor device 400. With the above thickness configuration, the combination of the semiconductor device 300 and the semiconductor device 400 may suffer less stress or compression force during manufacture of the semiconductor device package 10. For example, during operations such as printing or screening a photoresist layer or an insulation layer, or during any kind of flatness treatment, the combination of the semiconductor device 300 and the semiconductor device 400 may suffer less stress due to a total height or thickness which is less than a height or thickness (Th) of the interposer 200.

A redistribution layer (RDL) 300R is disposed within the space 200p. The RDL 300R is surrounded by the interposer 200. The RDL 300R is in contact with the semiconductor device 300. The RDL 300R is bonded with the semiconductor device 300. The RDL 300R may be electrically connected to the surface 3001 of the semiconductor device 300. An RDL 400R is disposed within the space 200p. The RDL 400R is surrounded by the interposer 200. The RDL 400R is in contact with the semiconductor device 400. The RDL 400R is bonded with the semiconductor device 400. The RDL 400R may be electrically connected to the surface 4002 of the semiconductor device 400. A thickness or a height Th of the interposer 200 may be greater than a thickness or a height of the combination of the semiconductor device 300, the semiconductor device 400, the RDL 300R and the RDL 400R.

The dielectric layer 810 is disposed on the surface 2002 of the interposer 200. The dielectric layer 810 has a portion within the space 200$p$. The dielectric layer 810 has a portion protruding into the space 200$p$. The dielectric layer 810 has a portion filling the space 200$p$. The dielectric layer 810 has a portion surrounded by the interposer 200. The dielectric layer 820 is disposed on the dielectric layer 810. The semiconductor device 400 is surrounded by the dielectric layer 810. The semiconductor device 400 is embedded in the dielectric layer 810. The dielectric layers 810 and 820 may include similar or the same materials. The dielectric layers 810 and 820 may include different materials. The dielectric layer 810 or 820 may include a PA material.

The RDL R1 is disposed on the surface 2001 of the interposer 200. The RDL R1 may be electrically connected to the semiconductor device 300 by the RDL 300R. The RDL R2 is disposed on the surface 2002 of the interposer 200. The RDL R2 is disposed on the dielectric layer 810. The RDL R2 may be electrically connected to the semiconductor device 400 by the RDL 400R and a through organic via (TGV) TG1. The RDL R1 and the RDL R2 may be electrically connected by a through silicon via (TSV) TS. The RDL R3 is disposed on the dielectric layer 820. The RDL R3 may be electrically connected to the RDL R2 by a TGV TG2. In some embodiments, due to the engaging of the sidewall 200$s$ of the interposer 200 and the sidewall 300$s$ of the semiconductor device 300, the combination of the semiconductor device 300 and the semiconductor 400 can be matched or combined with the interposer 200 with a relatively high degree of accuracy such that lines or patterns of the RDL 300R, 400R, R1, R2 or R3 can be designed to have fine widths between, for example, 2 µm and 10 µm.

The semiconductor device 500 is disposed on the dielectric layer 820. The semiconductor device 500 is disposed over the dielectric layer 820. The semiconductor device 500 may be electrically connected to the RDL R3. A protection layer or insulation layer 600 is disposed on the surface 2001 of the interposer 200. The protection layer 600 is disposed on the RDL R1. The protection layer 600 covers, surrounds or seals the RDL R1. Another protection layer or insulation layer 700 is disposed on the dielectric layer 820. The protection layer 700 is disposed on the RDL R3. The protection layer 700 covers, surrounds or seals the RDL R3. The protection layer 700 covers, surrounds or seals the semiconductor device 500.

The semiconductor device package 10 includes connection elements 900. The connection elements 900 electrically connect to the RDL R1 by pad or via structures P1. The connection elements 900 may include, for example but not limited to, a solder material. The connection elements 900 may be used to electrically connect the semiconductor device package 10 to an external structure such as a substrate or a printed circuit board.

Figure 1B:
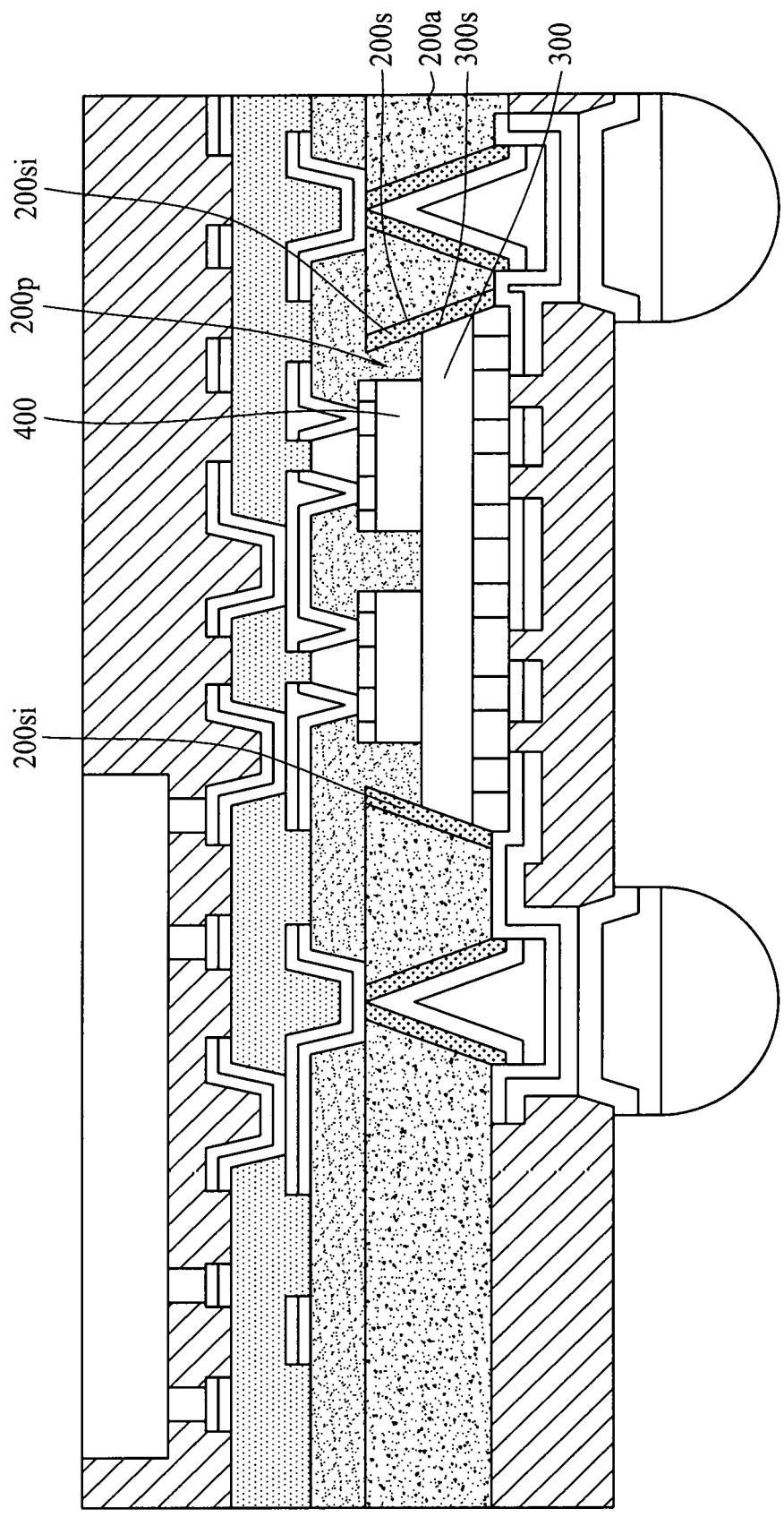
FIG. 1B illustrates a cross-sectional view of a semiconductor device package in accordance with some embodiments of the subject application.

FIG. 1B illustrates a cross-sectional view of a semiconductor device package 20 in accordance with some embodiments of the subject application. The semiconductor device package 20 is similar to the semiconductor device package 10 except that, the interposer 200*a* of the semiconductor device package 20 further includes an isolation layer 200*si*. The isolation layer 200*si* may function as a sidewall of the interposer 200*a*. The isolation layer 200*si* is in contact with the side surface 200*s* of the interposer 200. The isolation layer 200*si* is in contact with the semiconductor device 300. The isolation layer 200*si* is in contact with the sidewall 300*s* of the semiconductor device 300. The isolation layer 200*si* may avoid electrical short circuit. The isolation layer 200*si* may avoid electrical charge migration from the interposer 200*a* to the semiconductor device 300.

Figure 1C:
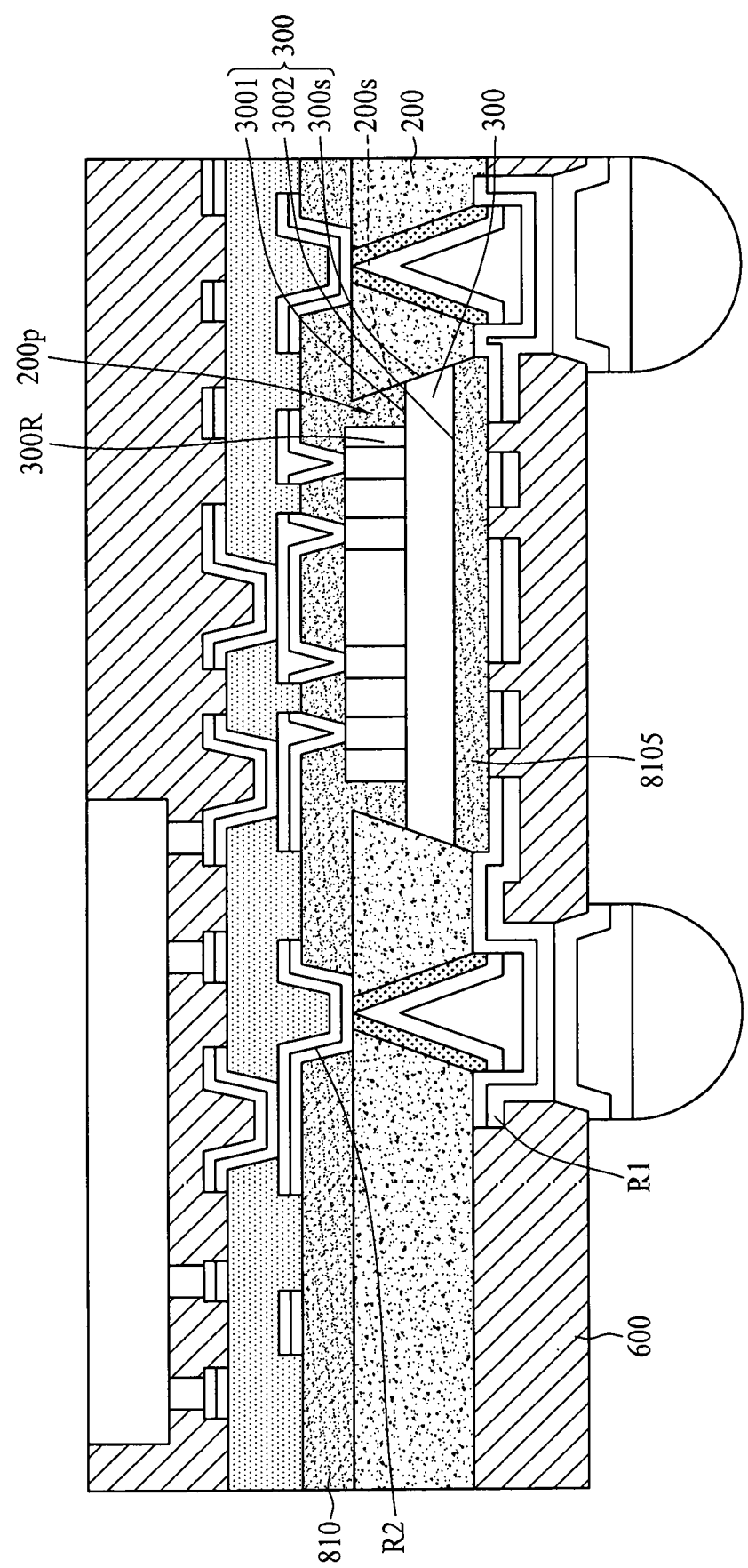
FIG. 1C illustrates a cross-sectional view of a semiconductor device package in accordance with some embodiments of the subject application.

FIG. 1C illustrates a cross-sectional view of a semiconductor device package 30 in accordance with some embodiments of the subject application. The semiconductor device package 30 is similar to the semiconductor device package 10 except for the following differences.

In the semiconductor device package 30, the semiconductor devices 400 as shown in FIG. 1A are eliminated, and the semiconductor device 300 is remained within the space 200*p*. The RDL 300R is disposed on the surface 3001 of the semiconductor device 300. The RDL 300R electrically connects the semiconductor device 300 to the RDL R2. A portion 8105 of the dielectric layer 810 is between the semiconductor device 300 and the protection layer 600.

Figure 2A:
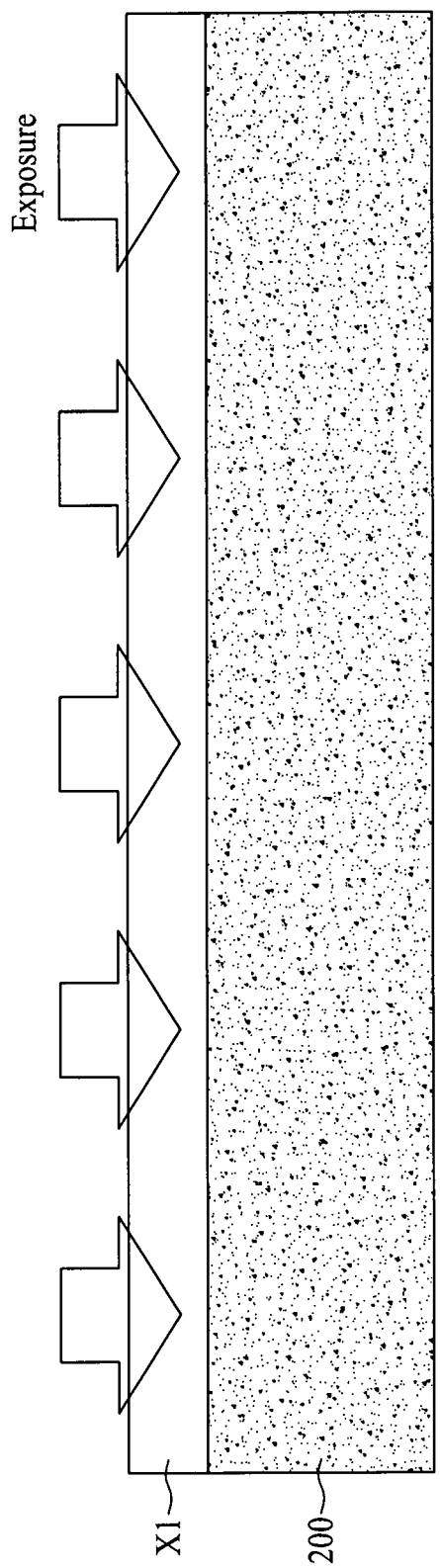
Figure 2B:
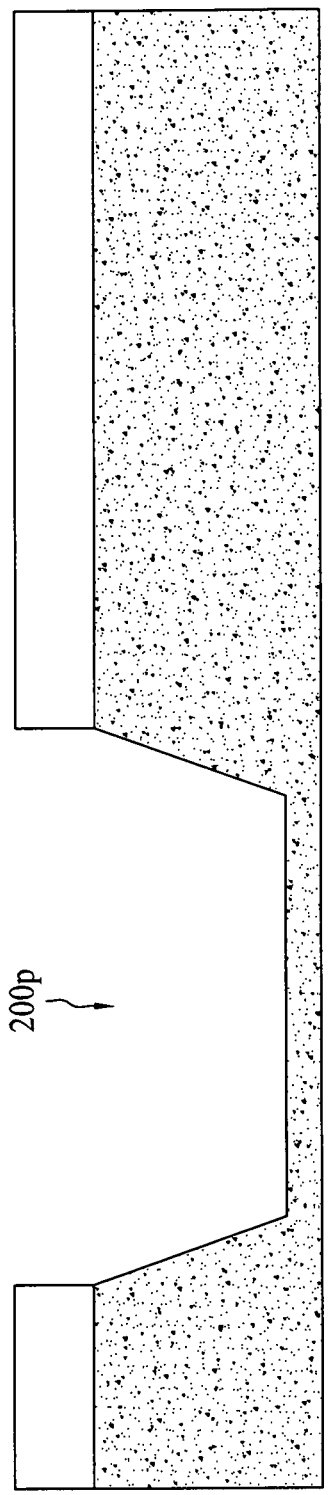
Figure 2C:
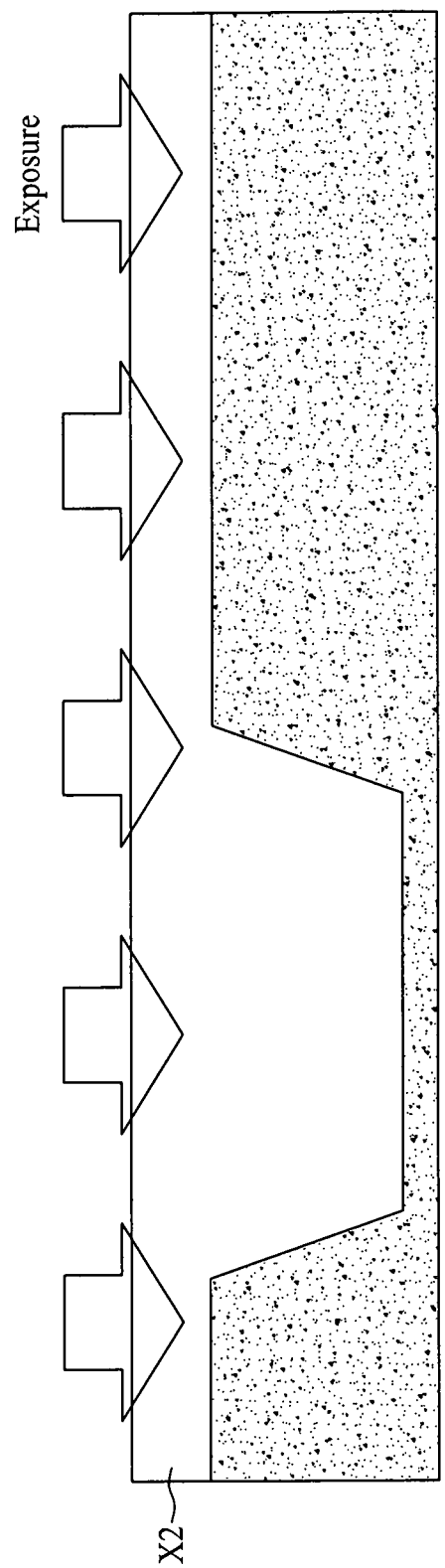
Figure 2D:
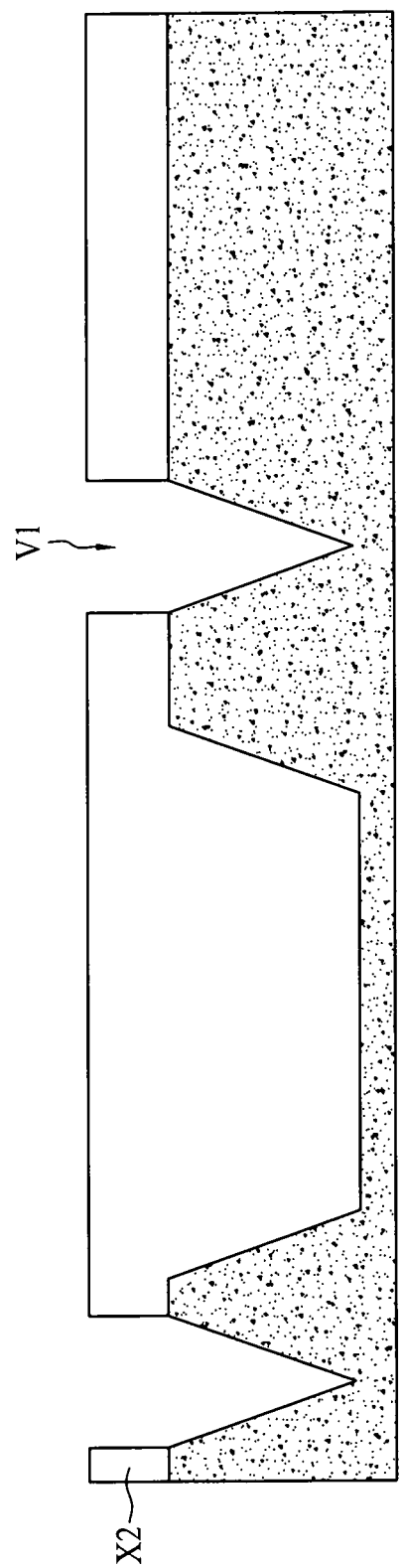
Figure 2F:
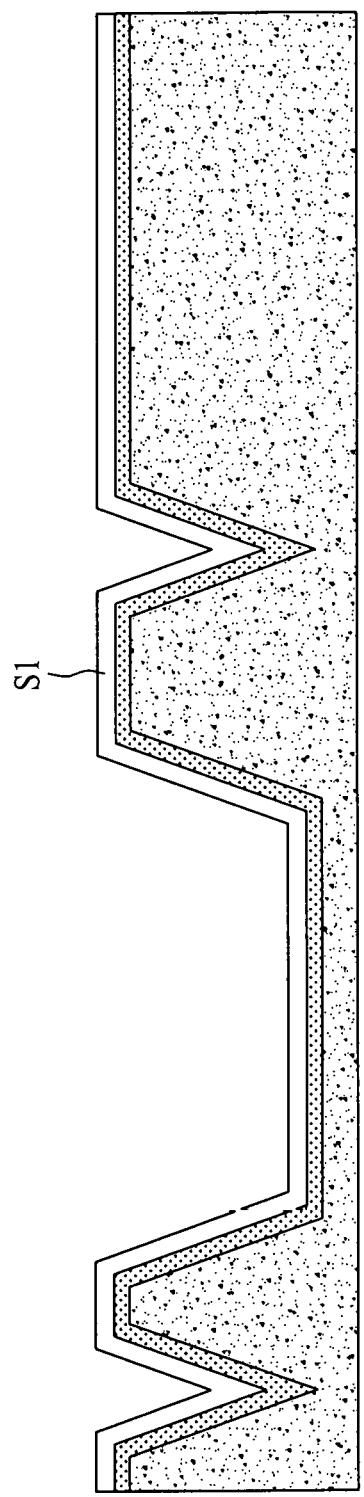
Figure 2G:
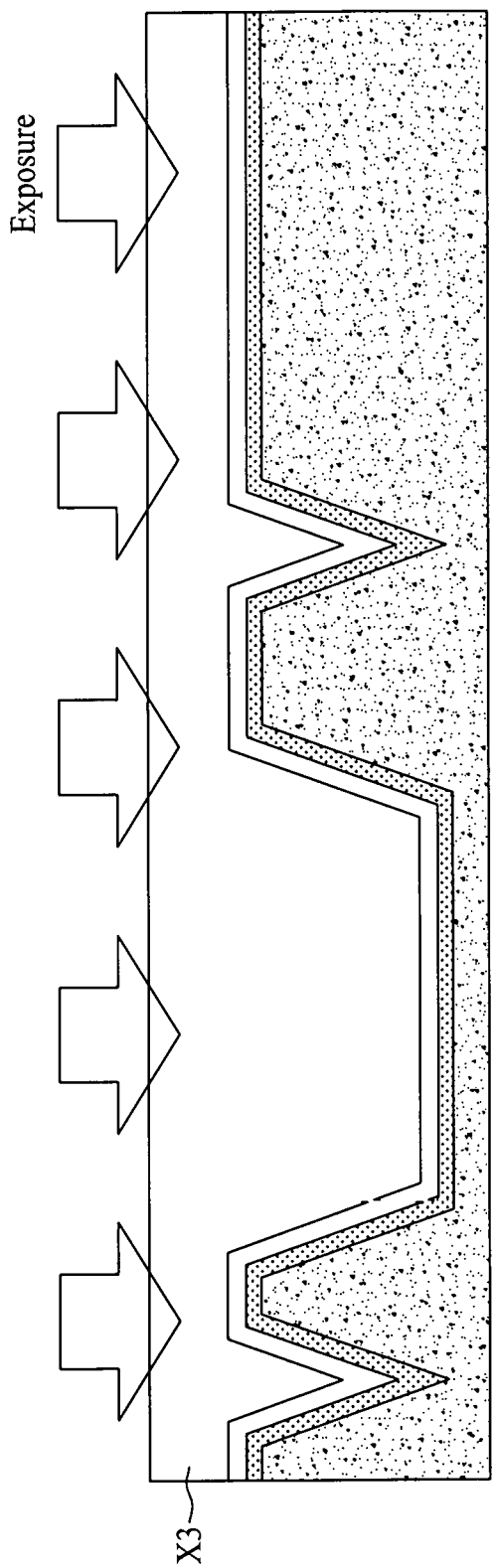
Figure 2H:
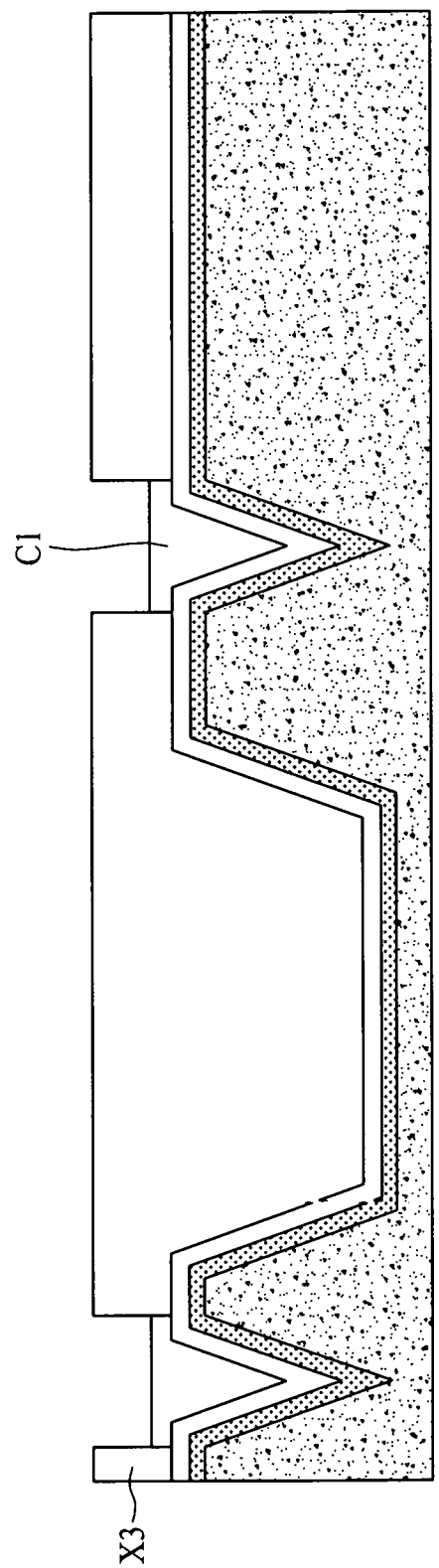
Figure 2I:
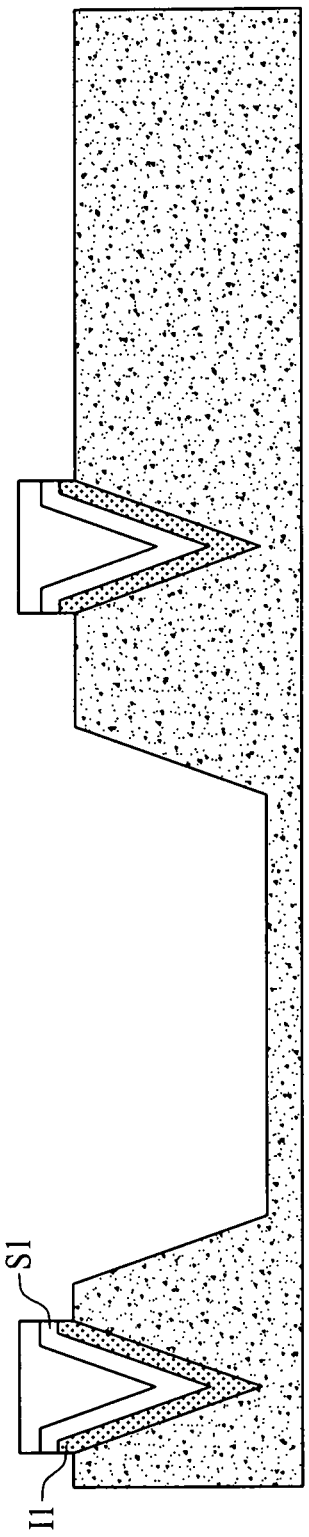
Figure 2J:
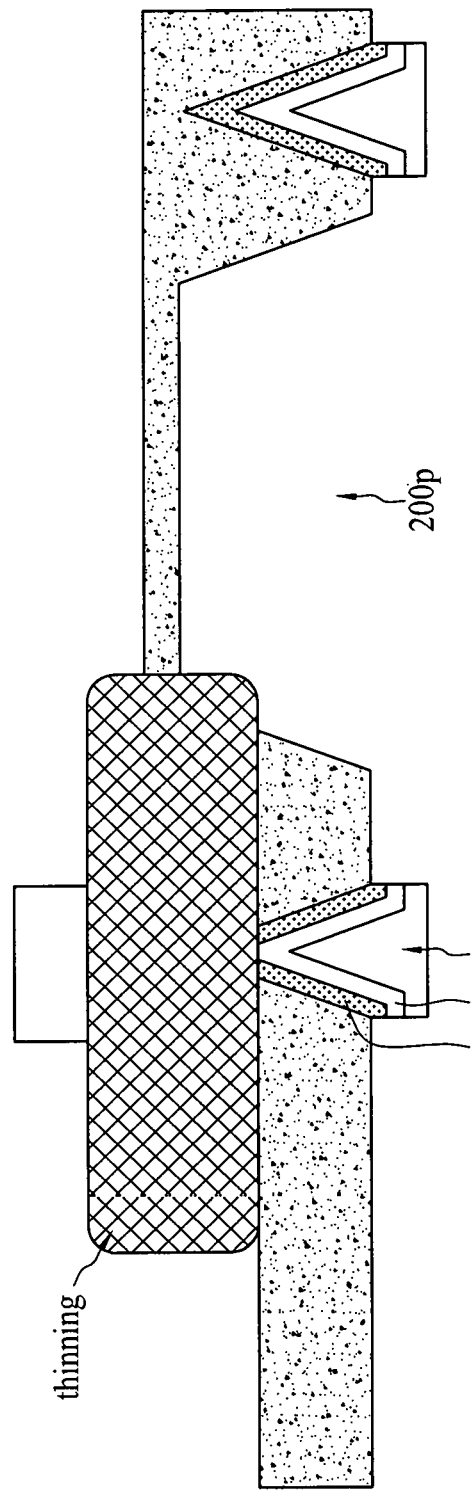
Figure 2K:
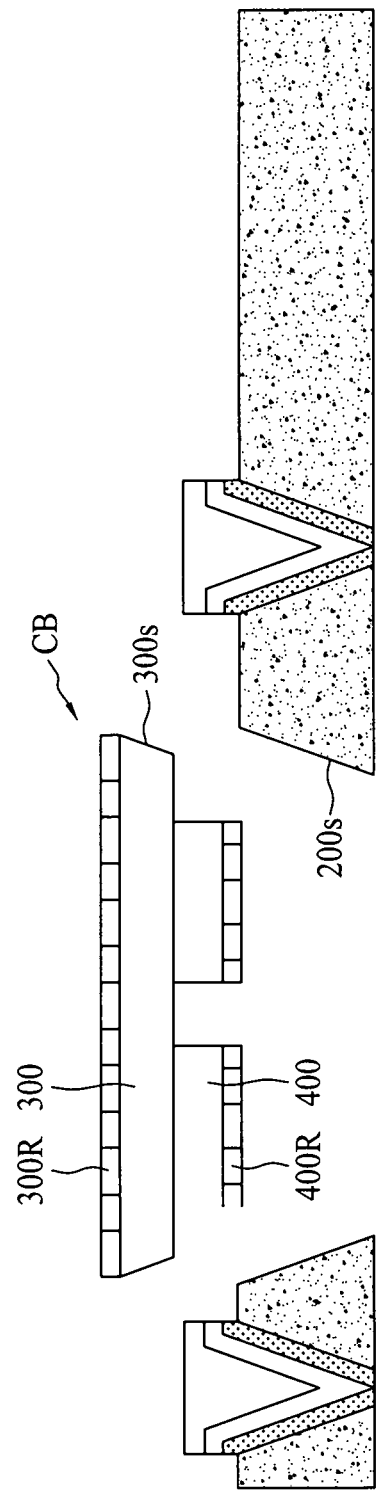
Figure 2L:
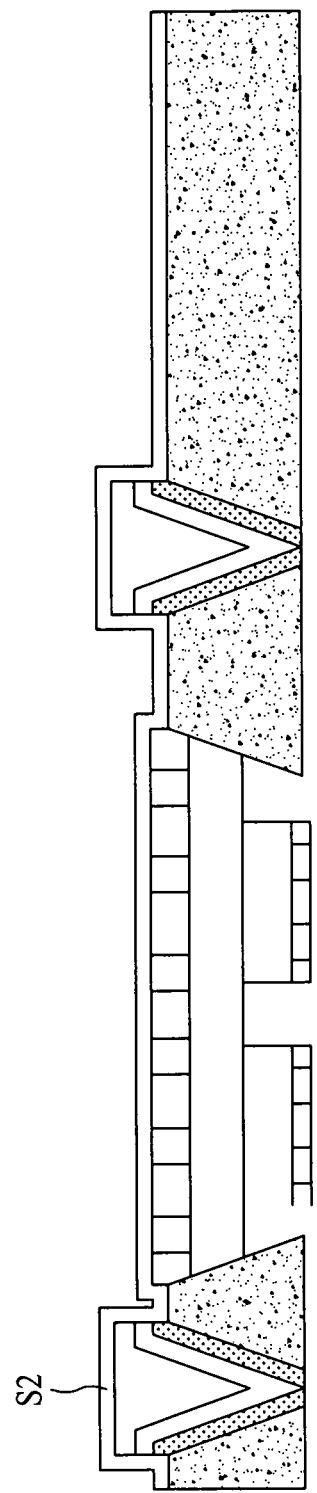
Figure 2M:
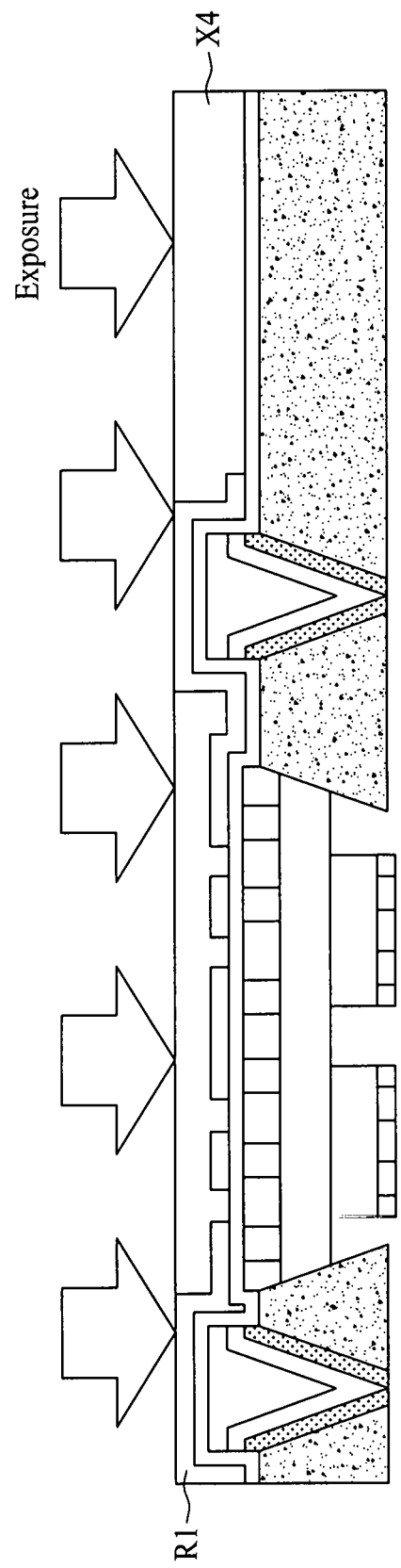
Figure 20:
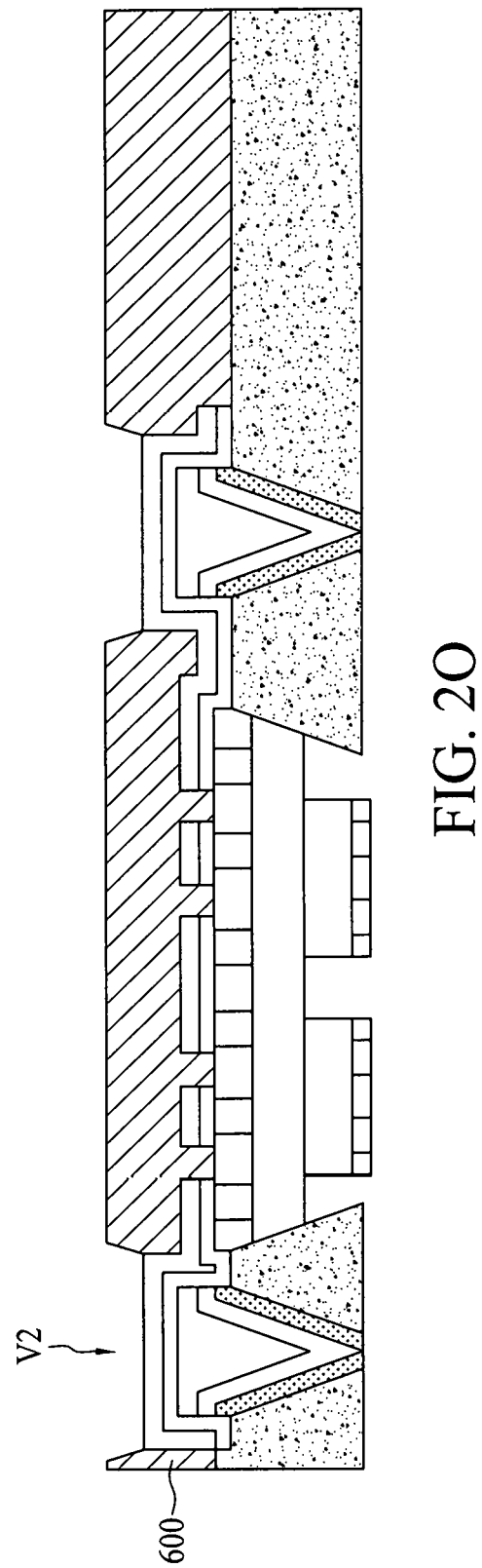
Figure 2P:
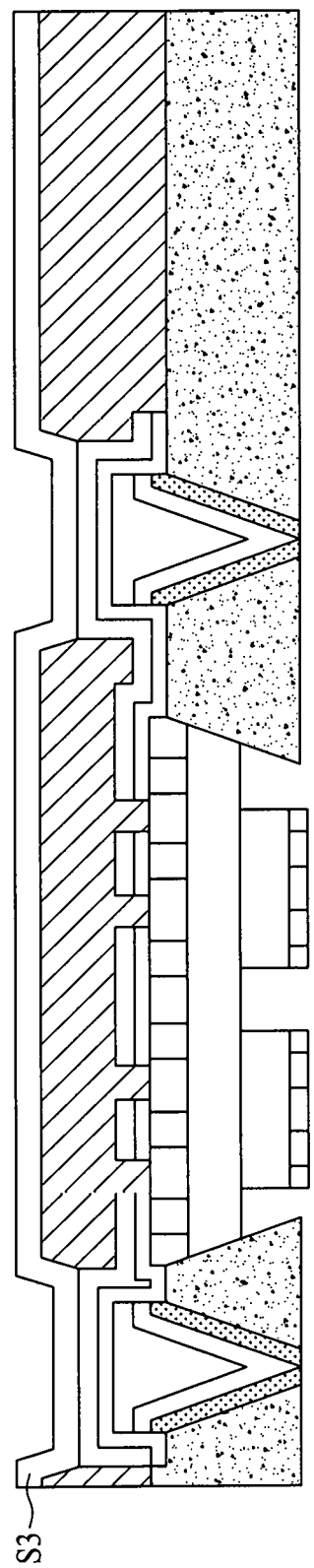
Figure 2Q:
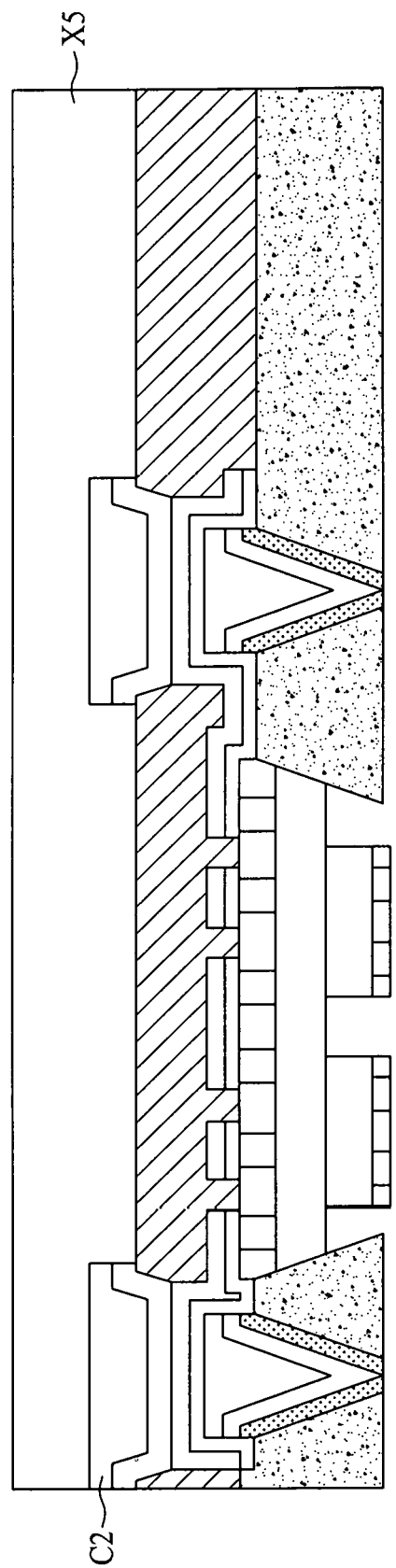
Figure 2R:
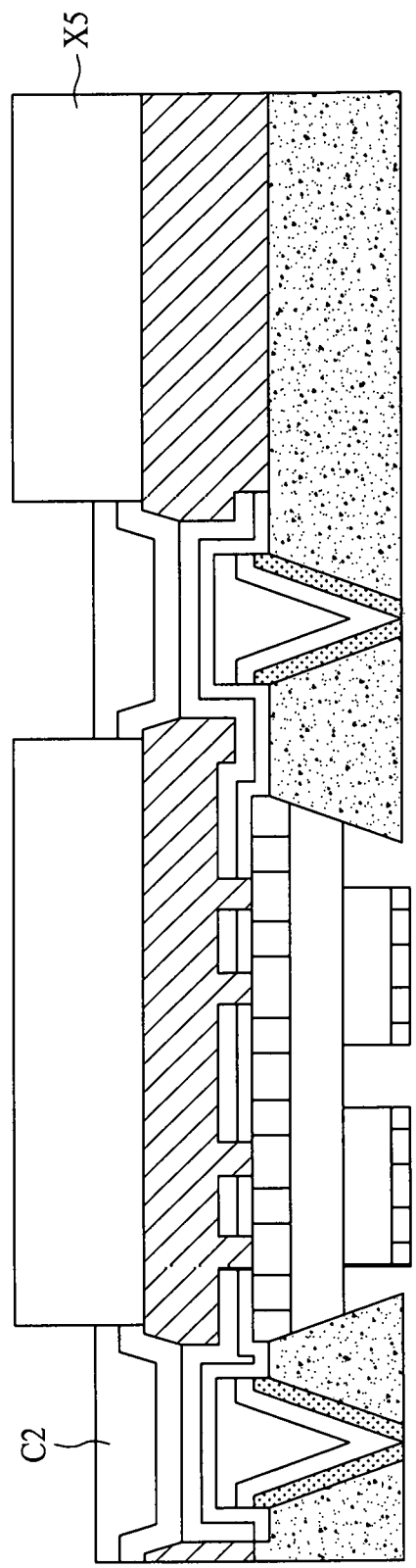
Figure 2S:
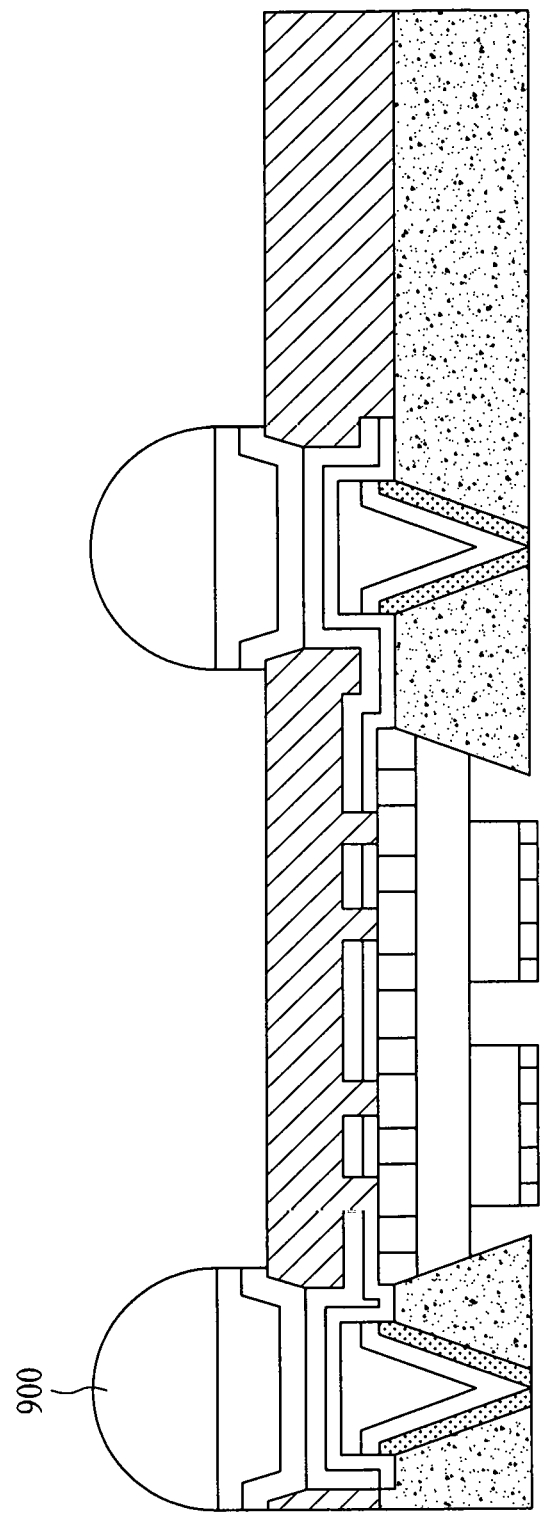
Figure 2T:
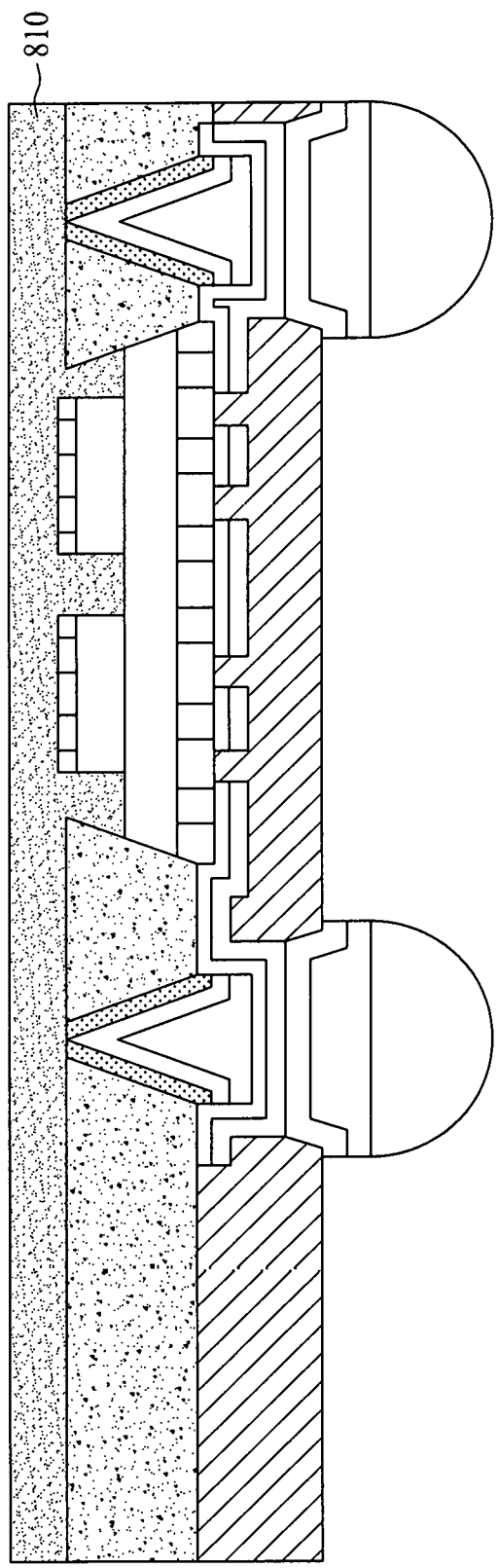
Figure 2U:
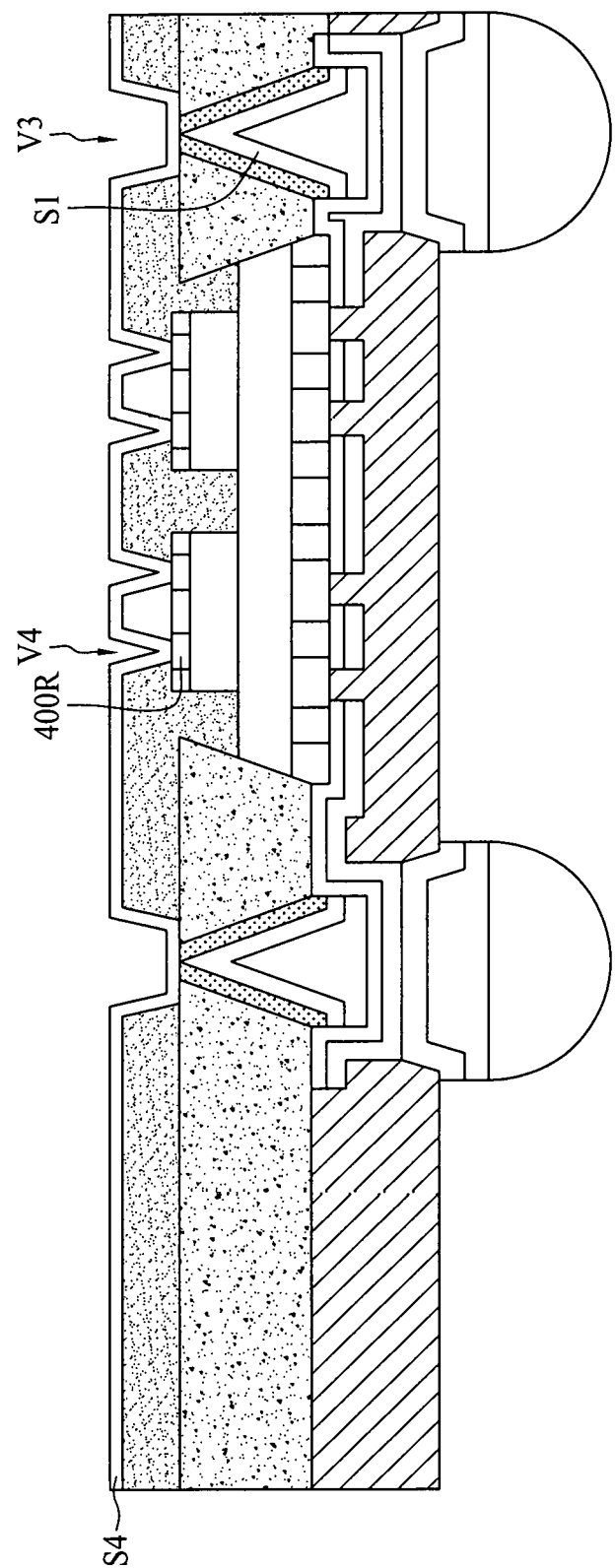
Figure 2V:
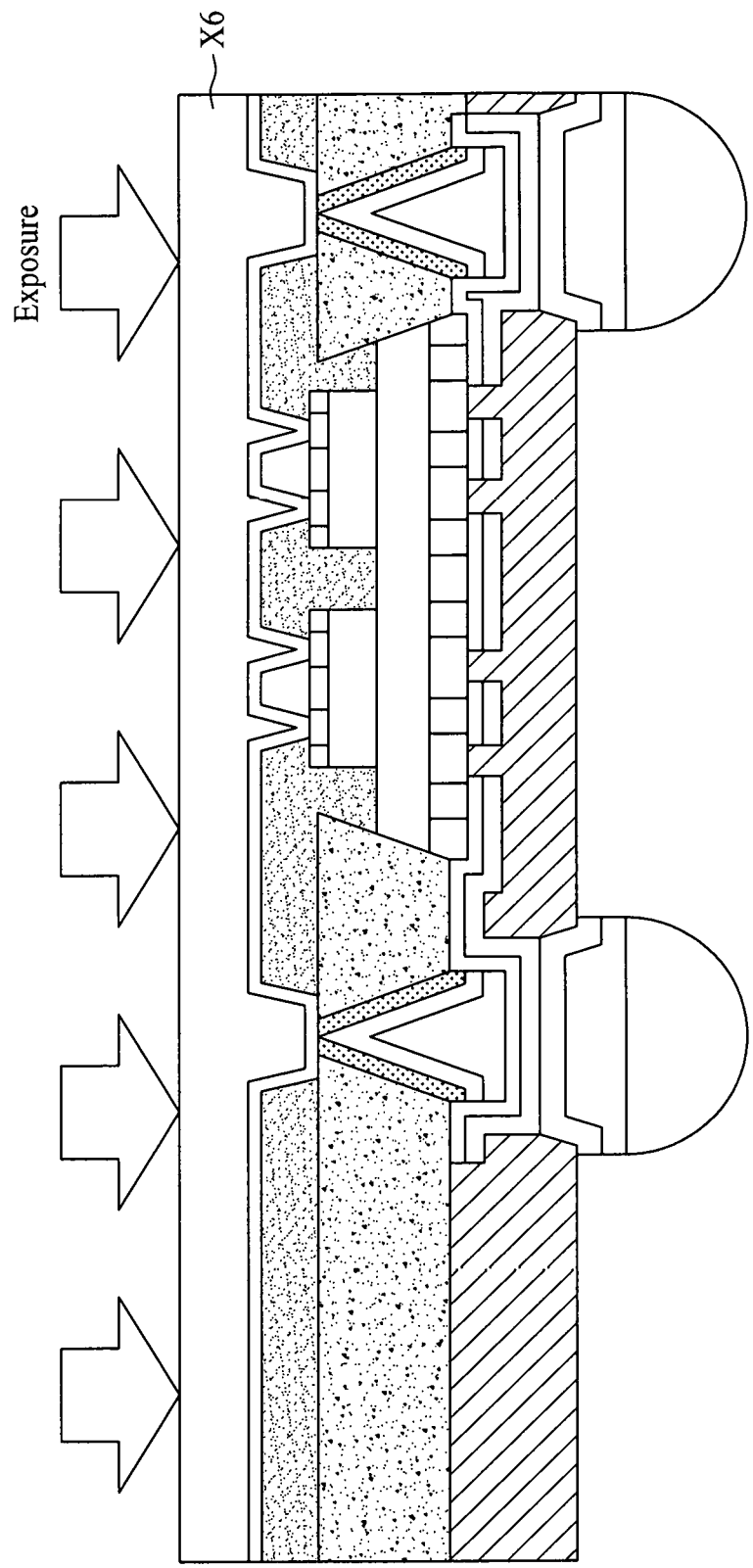
Figure 2W:
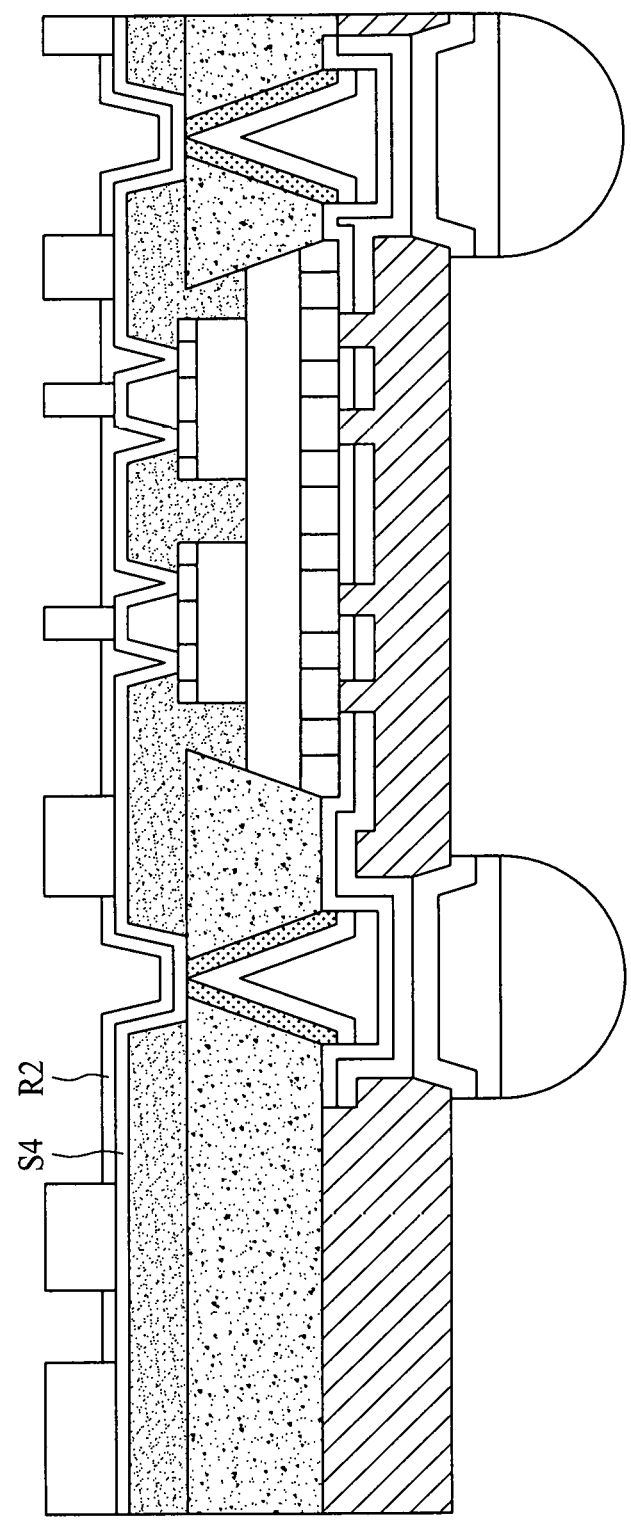
Figure 2X:
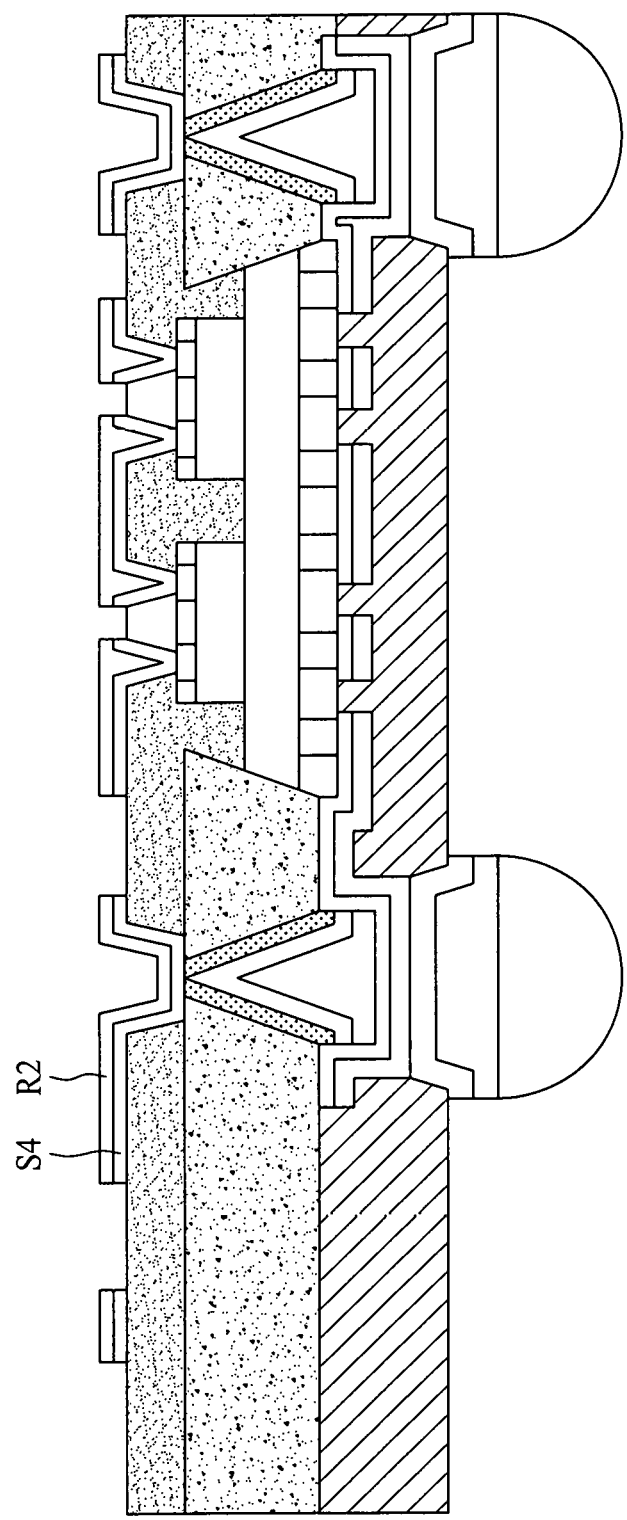
Figure 2Y:
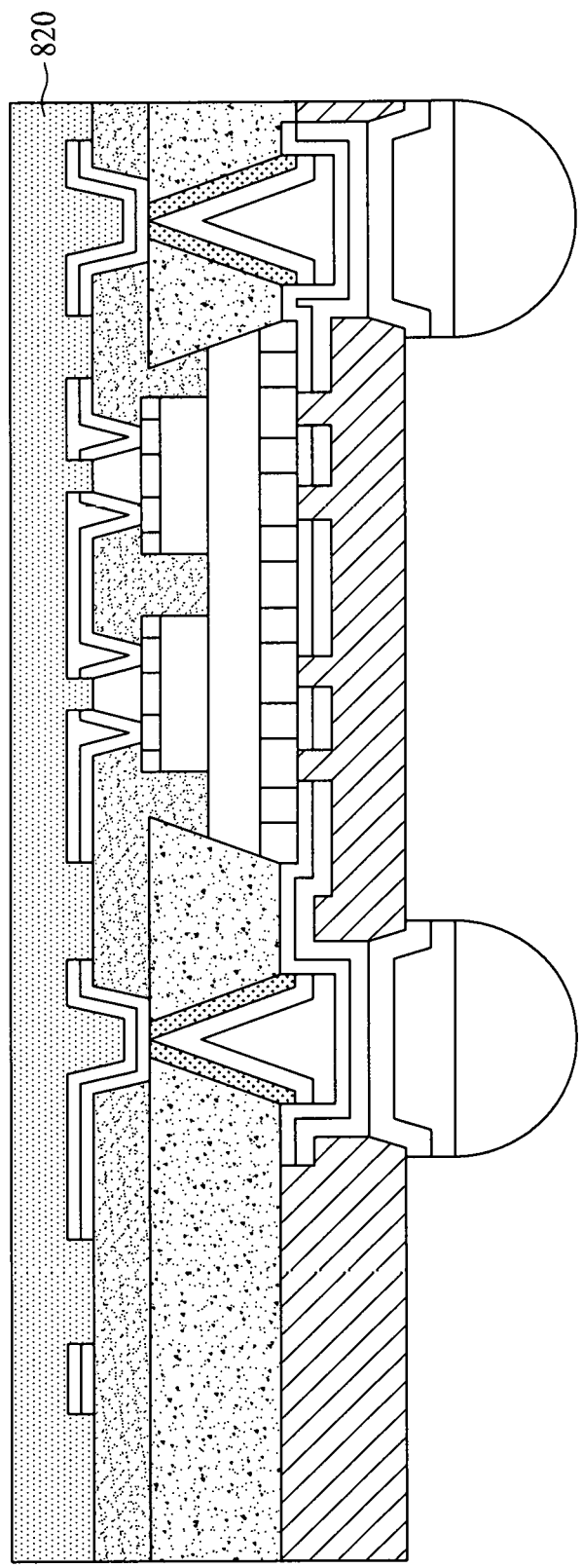
Figure 2Z:
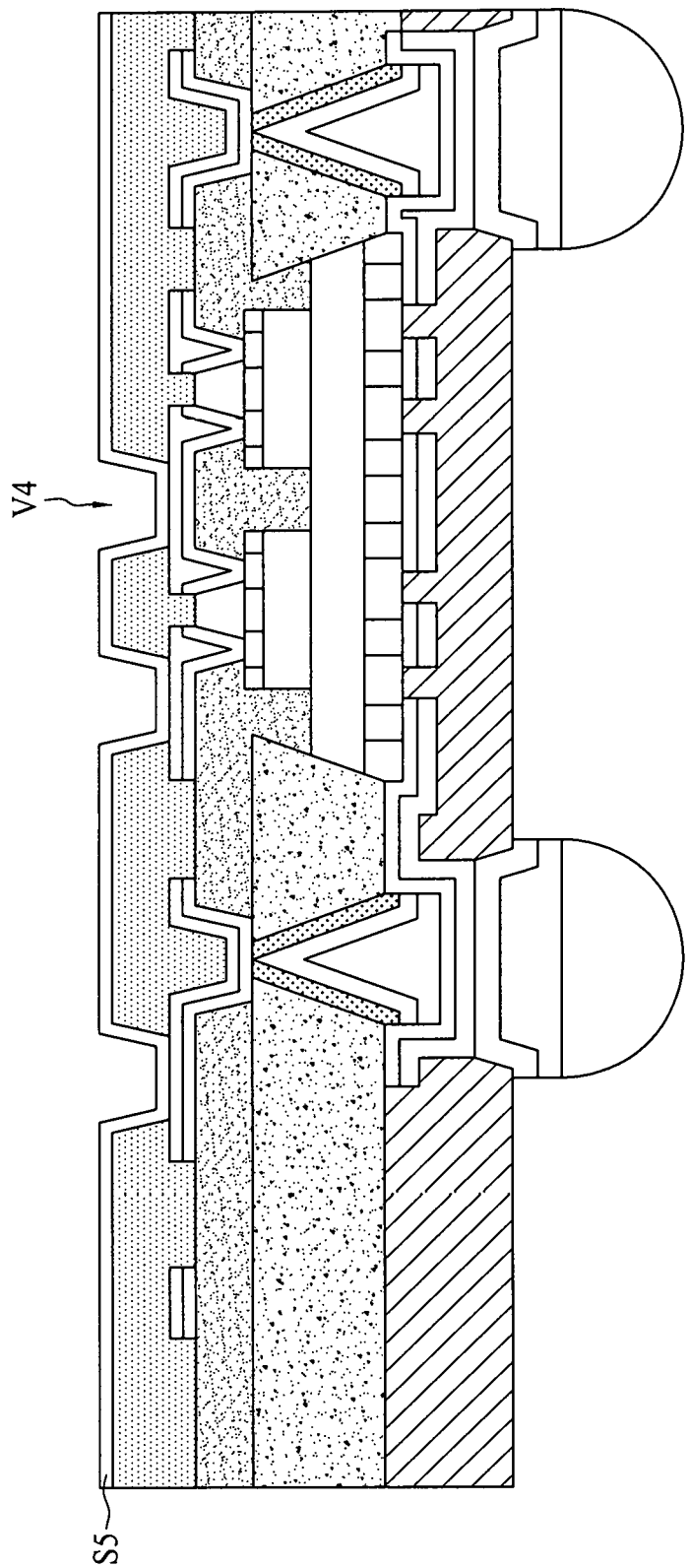
Figure 2A:
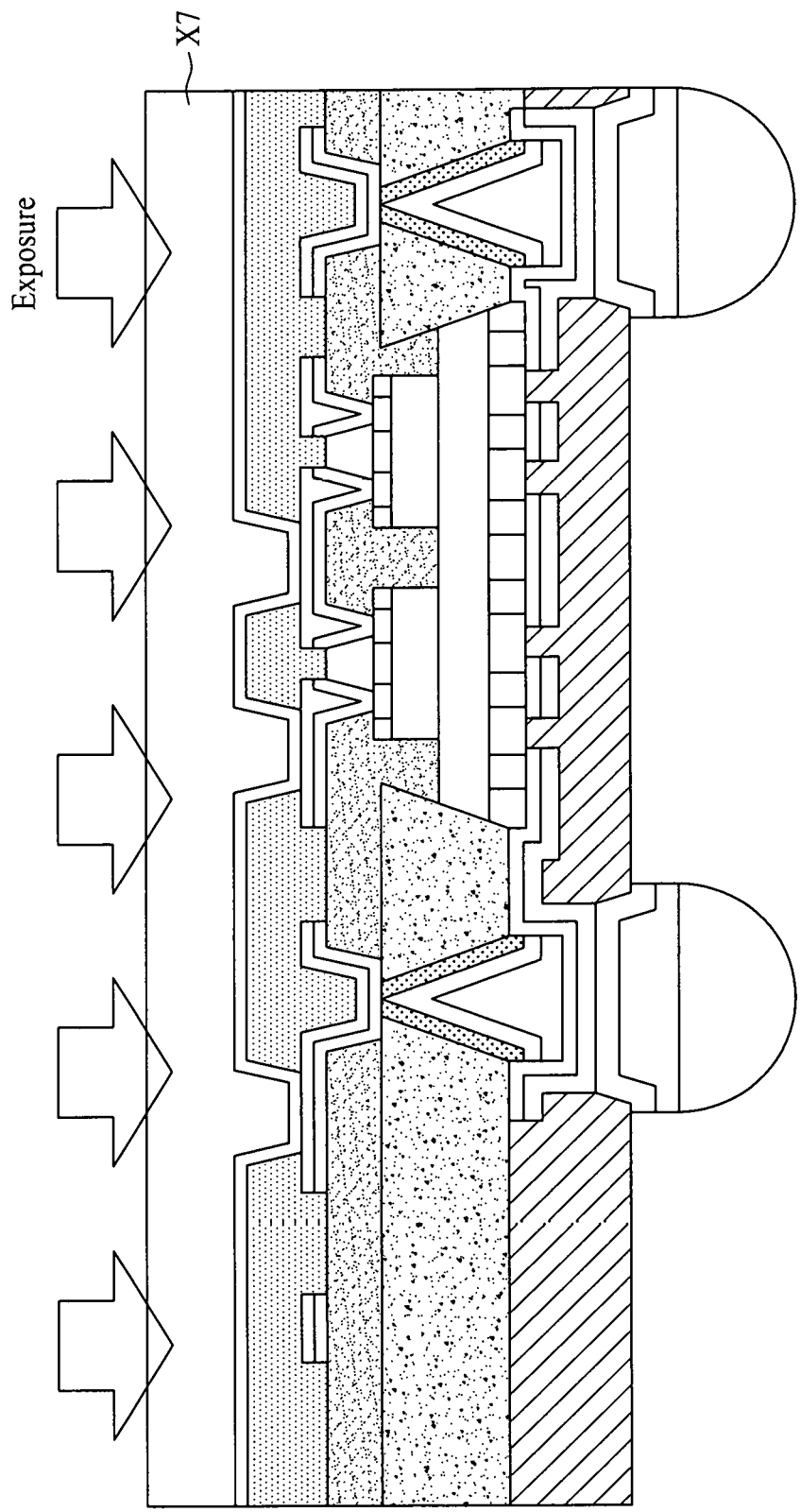
Figure 2B:
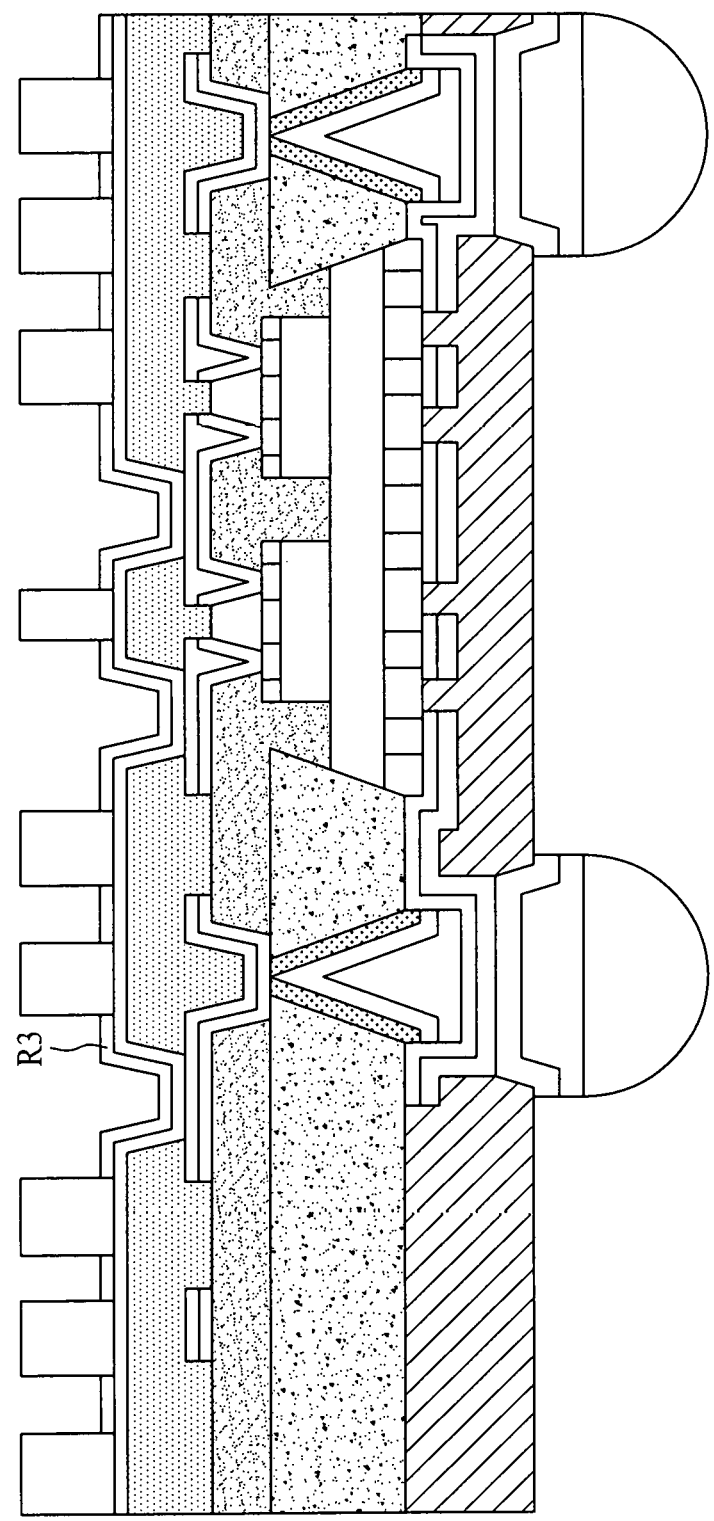
Figure 2C:
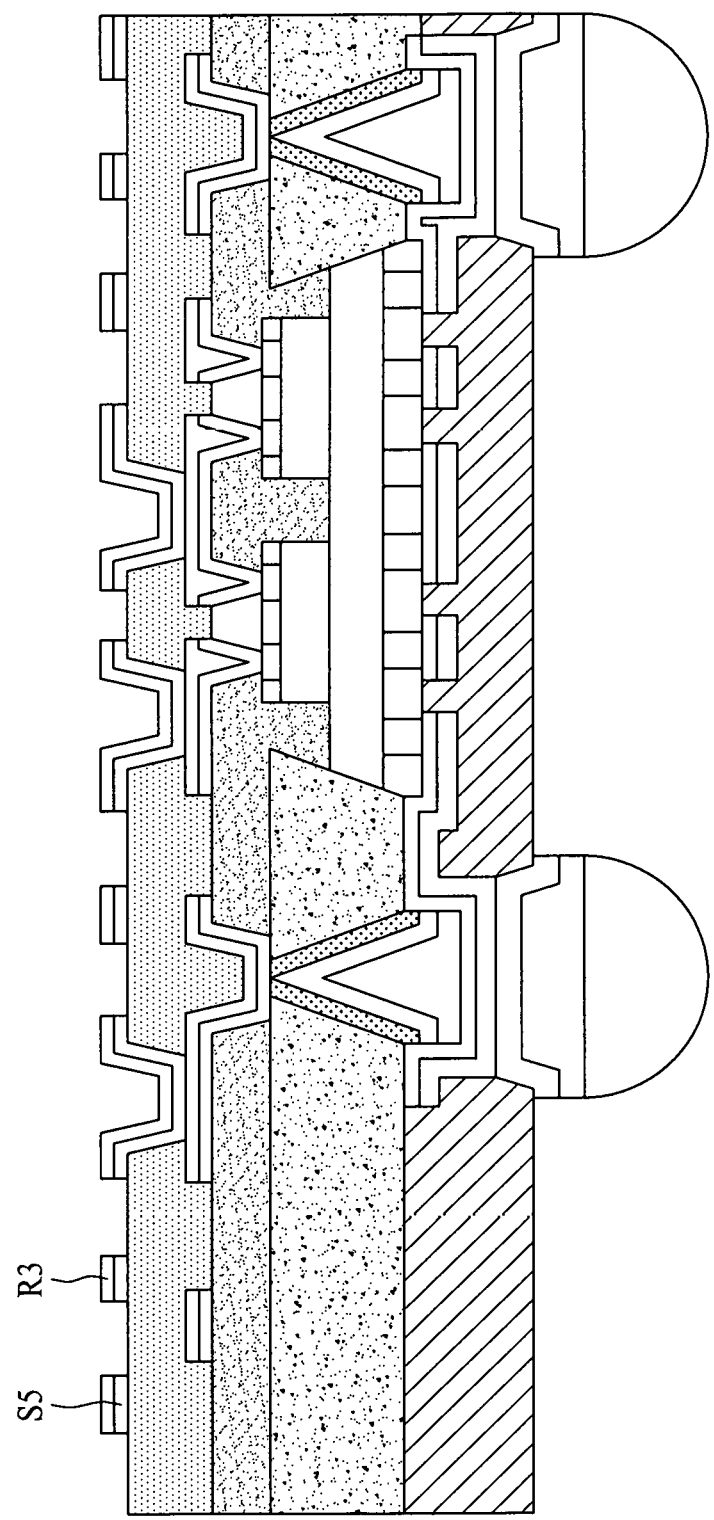
Figure 2D:
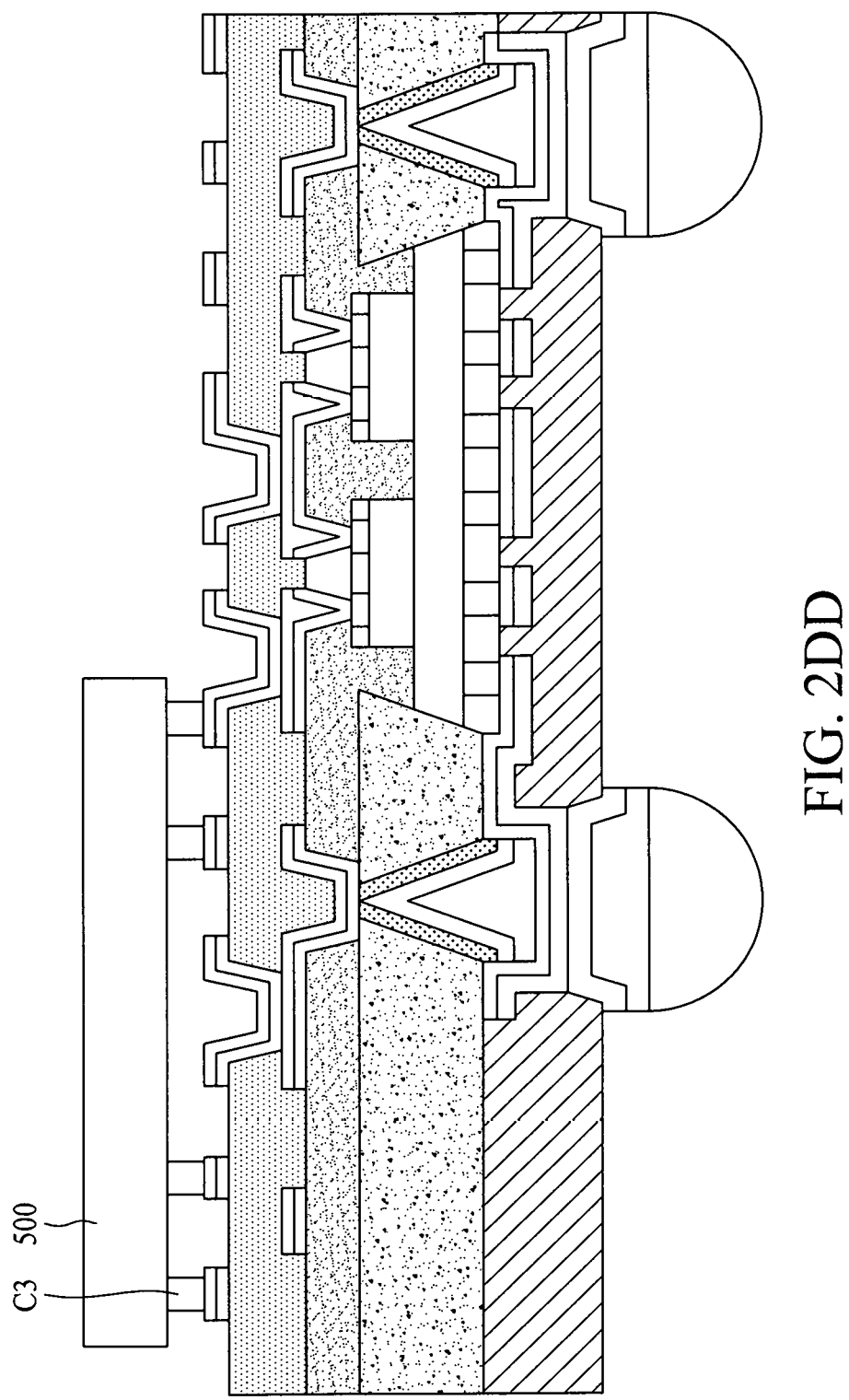
Figure 2E:
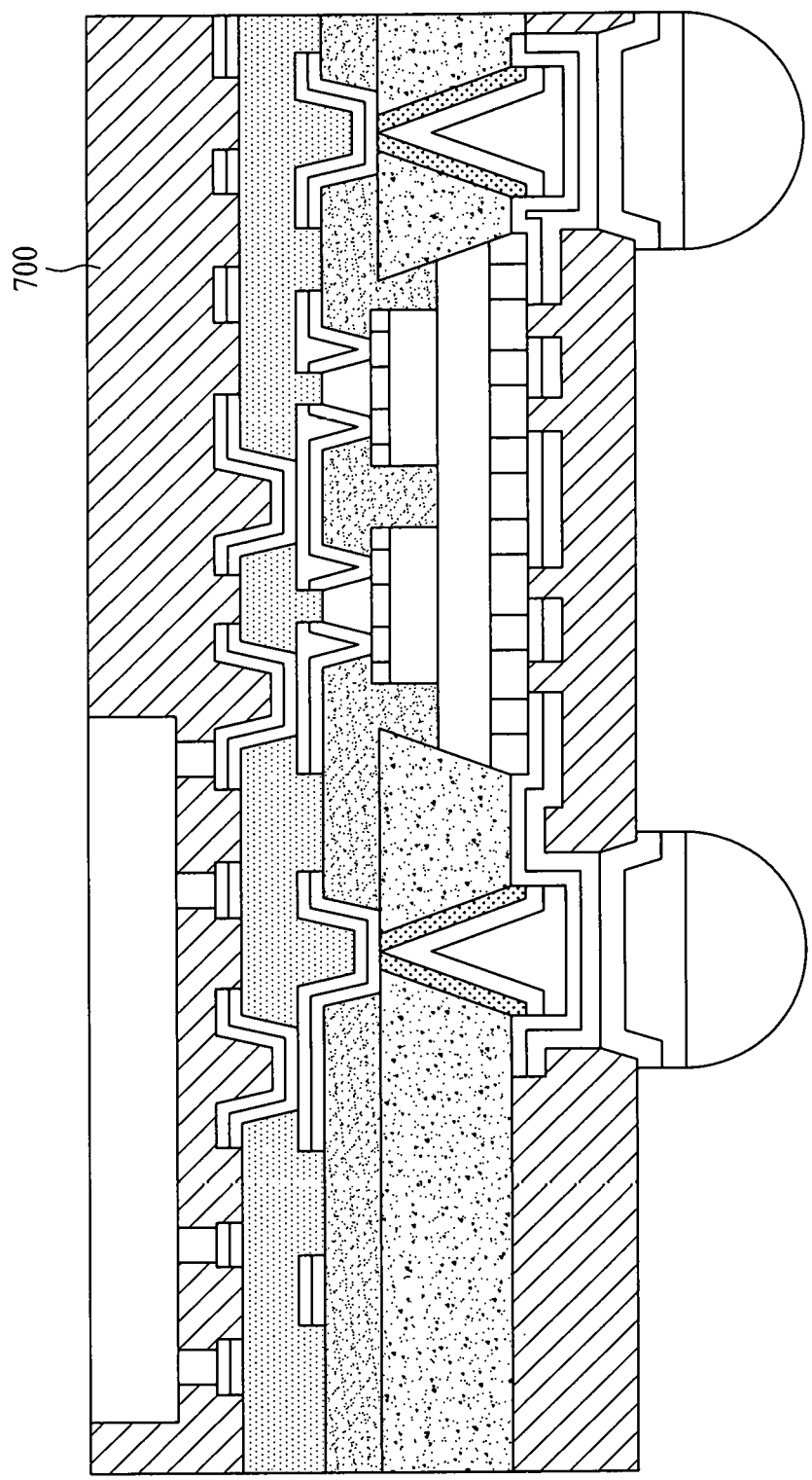
Figure 2F:
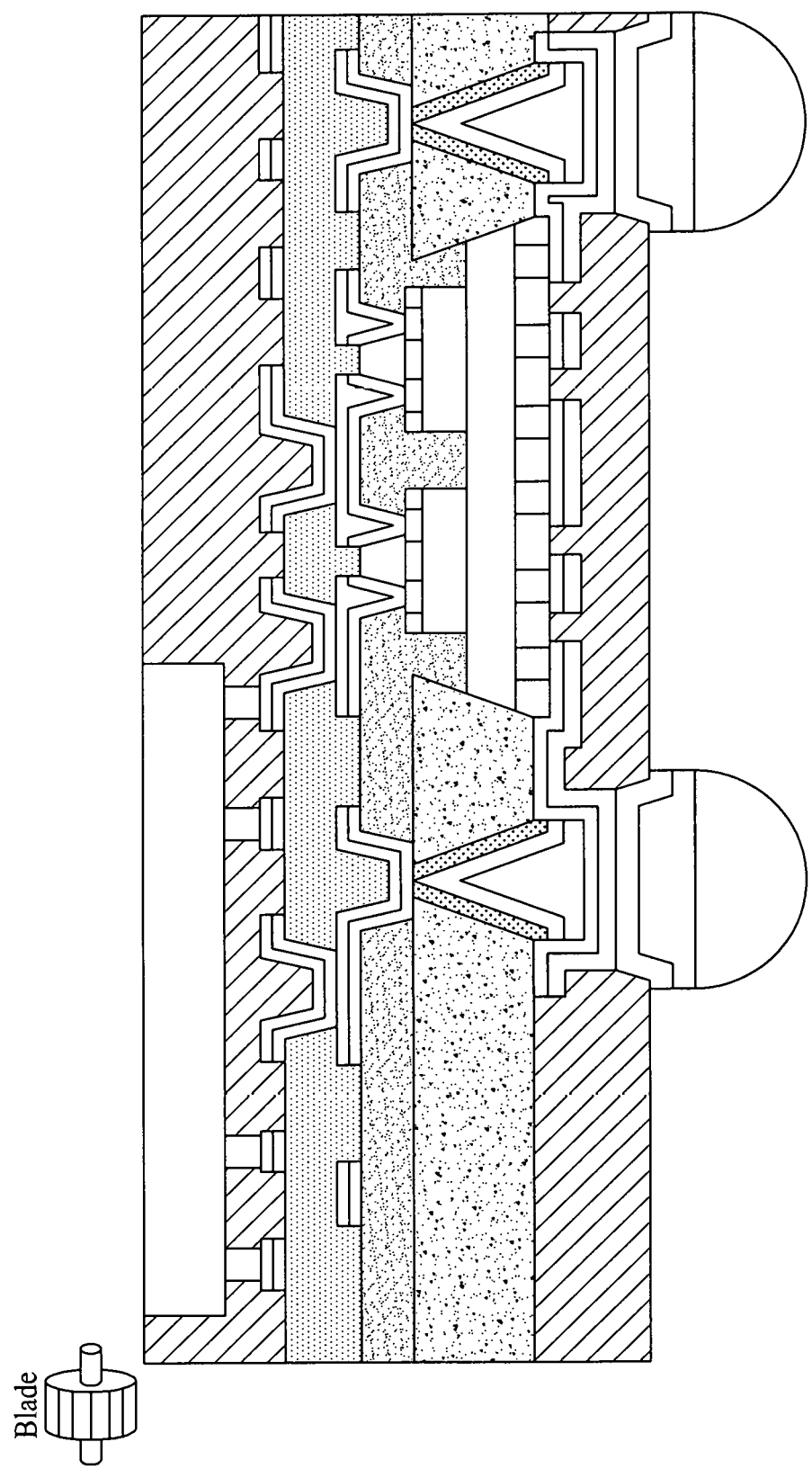

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N, FIG. 2O, FIG. 2P, FIG. 2Q, FIG. 2R, FIG. 2S, FIG. 2T, FIG. 2U, FIG. 2V, FIG. 2W, FIG. 2X, FIG. 2Y, FIG. 2Z, FIG. 2AA, FIG. 2BB, FIG. 2CC, FIG. 2DD, FIG. 2EE and FIG. 2FF show operations of manufacturing a semiconductor device package in accordance with some embodiments of the subject application.

Referring to FIG. 2A, an interposer or carrier 200 is provided. A photo-sensitive material (e.g. a photoresist (PR) material) X1 is formed on the interposer 200. The photo-sensitive material X1 may be formed by, for example and not limited to, a coating, printing, or screening process. A lithography operation is performed to expose the photo-sensitive material X1.

Referring to FIG. 2B, the photo-sensitive material X1 is developed. A portion of the photo-sensitive material X1 is removed. A portion of the photo-sensitive material X1 may be removed by, for example and not limited to, an etching operation. A portion of the interposer 200 is removed to form a space or cavity 200*p*. A portion of the interposer 200 may be removed by, for example and not limited to, a wet etching operation. A portion of the interposer 200 may be removed anisotropically.

Referring to FIG. 2C, the photo-sensitive material X1 is removed. A photo-sensitive material (e.g. a PR material) X2 is formed on the interposer 200. The photo-sensitive material X2 fills the space 200*p*. The photo-sensitive material X2 may be formed by, for example and not limited to, a coating, printing, or screening process. A lithography operation is performed to expose the photo-sensitive material X2.

Referring to FIG. 2D, the photo-sensitive material X2 is developed. A portion of the photo-sensitive material X2 is removed. A portion of the photo-sensitive material X1 may be removed by, for example and not limited to, an etching operation. A portion of the interposer 200 is removed to form a via V1. The via V1 may be formed by, for example and not limited to, an etching or laser drilling operation.

Referring to FIG. 2E, the photo-sensitive material X2 is removed. An isolation layer I1 is formed on the interposer 200. The isolation layer I1 is formed conformal to a surface of the via V1. The isolation layer I1 is formed conformal to a surface of the cavity 200*p*. The isolation layer I1 may include an oxidation layer. The isolation layer I1 may include a silicon oxidation layer. The isolation layer I1 may be formed by, for example and not limited to, a chemical vapor deposition (CVD) operation.

Referring to FIG. 2F, a seed layer S1 is formed on the isolation layer I1. The seed layer S1 may include a conductive material such as a metal or metal alloy. The seed layer S1 may include gold (Au), silver (Ag), aluminum (Al), copper (Cu), or an alloy thereof. The seed layer S1 may be formed by, for example and not limited to, a physical vapor deposition (PVD) operation or a plating operation.

Referring to FIG. 2G, a photo-sensitive material (e.g. a PR material) X3 is formed on the seed layer S1. The photo-sensitive material X3 may be formed by, for example and not limited to, a coating, printing, or screening process. A lithography operation is performed to expose the photo-sensitive material X3.

Referring to FIG. 2H, the photo-sensitive material X3 is developed. A portion of the photo-sensitive material X3 is removed. A portion of the photo-sensitive material X3 may be removed by, for example and not limited to, an etching operation. The via V1 is exposed. A conductive material C1 is formed within the via V1. The conductive material C1 may include gold (Au), silver (Ag), aluminum (Al), copper (Cu), or an alloy thereof. The conductive material C1 may be formed by, for example and not limited to, a plating operation.

Referring to FIG. 2I, the photo-sensitive material X3 is removed. A portion of the seed layer S1 is removed by, for example and not limited to, an etching operation. A portion of the isolation layer I1 is removed by, for example and not limited to, an etching operation. Although it is not illustrated in FIG. 2I, it is contemplated that the isolation layer I1 may be remained in accordance with some other embodiments of the subject application.

Referring to FIG. 2J, a thinning operation is performed. The thinning operation may include a grinding operation. The thinning operation exposes the via V1. The thinning operation exposes the seed layer S1. The thinning operation exposes the isolation layer I1. The space $200p$ penetrates through the interposer 200.

Referring to FIG. 2K, a stack structure or a semiconductor device combo CB is provided. The stack structure CB includes a semiconductor device 300, two semiconductor devices 400, RDL layers 300R and 400R. The stack structure CB is disposed into the space $200p$. The stack structure CB may be disposed into the space $200p$ by, for example and not limited to, a pick and place operation. A surface $300s$ of the semiconductor device 300 is engaged with a surface $200s$ of the interposer 200. The stack structure CB is bonded with the interposer 200.

Referring to FIG. 2L, a seed layer S2 is formed on the interposer 200. The seed layer S2 is formed on the RDL 300R. The seed layer S2 is formed on the conductive material C1. The seed layer S2 may include a conductive material such as a metal or metal alloy. The seed layer S2 may include gold (Au), silver (Ag), aluminum (Al), copper (Cu), or an alloy thereof. The seed layer S2 may be formed by, for example and not limited to, a PVD operation or a plating operation.

Referring to FIG. 2M, an RDL layer R1 is formed on the seed layer S2. The RDL R1 may be formed by a lithographic operation, a plating operation or any suitable operation. A photo-sensitive material X4 is formed on the seed layer S2. The photo-sensitive material X4 is formed on the RDL R1. The photo-sensitive material X4 may be formed by, for example and not limited to, a coating, printing, or screening process. A lithography operation is performed to expose the photo-sensitive material X4.

Referring to FIG. 2N, the photo-sensitive material X4 is developed. A portion of the photo-sensitive material X4 is removed. A portion of the photo-sensitive material X4 may be removed by, for example and not limited to, an etching operation. The RDL layer R1 is exposed.

Referring to FIG. 2O, the photo-sensitive material X4 is removed. A portion of the seed layer S2 is removed. A portion of the interposer 200 is exposed. A protection layer 600 is formed on the interposer 200. The protection layer 600 is formed on the RDL R1. The protection layer 600 may be formed by a lamination operation. The protection layer 600 may be formed by a compression operation. The protection layer 600 may include a PA layer. The protection layer 600 may include a molding compound. A via V2 is formed in the protection layer 600. A portion of the RDL R1 is exposed. The via V2 may be formed by, for example and not limited to, a laser drilling operation.

Referring to FIG. 2P, a seed layer S3 is formed on the protection layer 600. The seed layer S3 is formed on the exposed portion of the RDL 300R. The seed layer S3 may include a conductive material such as a metal or metal alloy. The seed layer S3 may include gold (Au), silver (Ag), aluminum (Al), copper (Cu), or an alloy thereof. The seed layer S3 may be formed by, for example and not limited to, a PVD operation or a plating operation.

Referring to FIG. 2Q, a conductive material C2 is formed on the seed layer S3. The conductive material C2 may include gold (Au), silver (Ag), aluminum (Al), copper (Cu), or an alloy thereof. The conductive material C2 may be formed by, for example and not limited to, a plating operation. A portion of the seed layer S3 is removed. A portion of the protection layer 600 is exposed. A photo-sensitive material (e.g. a PR material) X5 is formed on the protection layer 600. The photo-sensitive material X5 may be formed by, for example and not limited to, a coating, printing, or screening process. A lithography operation is performed to expose the photo-sensitive material X5.

Referring to FIG. 2R, the photo-sensitive material X5 is developed. A portion of the photo-sensitive material X5 is removed. A portion of the photo-sensitive material X5 may be removed by, for example and not limited to, an etching operation. The conductive material C2 is exposed.

Referring to FIG. 2S, a connection element 900 is formed on the conductive material C2. The forming of the connection element 900 may include a reflow operation. The connection elements 900 may include, for example but not limited to, a solder material. The photo-sensitive material X5 is removed.

Referring to FIG. 2T, a dielectric layer 810 is formed on the interposer 200. The dielectric layer 810 is formed on the semiconductor device 300. The dielectric layer 810 is formed on the RDL 400R. The dielectric layer 810 may be formed by, for example and not limited to, a lamination, a printing, or a screening operation.

Referring to FIG. 2U, a portion of the dielectric layer 810 is removed. A via V3 is formed in the dielectric layer 810. The via V3 may be formed by a lithographic operation and an etching operation. A portion of the seed layer S1 is exposed. A via V4 is formed in the dielectric layer 810. The via V4 may be formed by a lithographic operation and an etching operation. A portion of the RDL 400R is exposed. A seed layer S4 is formed on the dielectric layer 810. The seed layer S4 is formed on the exposed portion of the seed layer S1. The seed layer S4 is formed on the exposed portion of the RDL 400R. The seed layer S4 may include a conductive material such as a metal or metal alloy. The seed layer S4 may include gold (Au), silver (Ag), aluminum (Al), copper (Cu), or an alloy thereof. The seed layer S4 may be formed by, for example and not limited to, a PVD operation or a plating operation.

Referring to FIG. 2V, a photo-sensitive material (e.g. a PR material) X6 is formed on the seed layer S4. The photo-sensitive material X6 may be formed by, for example and not limited to, a coating, printing, or screening process. A lithography operation is performed to expose the photo-sensitive material X6.

Referring to FIG. 2W, the photo-sensitive material X6 is developed. A portion of the photo-sensitive material X6 is removed. A portion of the photo-sensitive material X6 may be removed by, for example and not limited to, an etching operation. A portion of the seed layer S4 is exposed. An RDL layer R2 is formed on the seed layer S4. The RDL R2 may be formed by a plating operation or any suitable operation.

Referring to FIG. 2X, the photo-sensitive material X6 is removed. A portion of the seed layer S4 is exposed. The exposed portion of the seed layer S4 is removed by, for example and not limited to, an etching operation.

Referring to FIG. 2Y, a dielectric layer 820 is formed on the dielectric layer 810. The dielectric layer 820 is formed on the RDL R2. The dielectric layer 820 may be formed by, for example and not limited to, a lamination, a printing, or a screening operation.

Referring to FIG. 2Z, a portion of the dielectric layer 820 is removed. A via V4 is formed in the dielectric layer 820. The via V4 may be formed by a lithographic operation and an etching operation. A portion of the RDL R2 is exposed. A seed layer S5 is formed on the dielectric layer 820. The seed layer S5 is formed on the exposed portion of the RDL R2. The seed layer S5 may include a conductive material such as a metal or metal alloy. The seed layer S5 may include gold (Au), silver (Ag), aluminum (Al), copper (Cu), or an alloy thereof. The seed layer S5 may be formed by, for example and not limited to, a PVD operation or a plating operation.

Referring to FIG. 2AA, a photo-sensitive material (e.g. a PR material) X7 is formed on the seed layer S5. The photo-sensitive material X7 may be formed by, for example and not limited to, a coating, printing, or screening process. A lithography operation is performed to expose the photo-sensitive material X7.

Referring to FIG. 2BB, the photo-sensitive material X7 is developed. A portion of the photo-sensitive material X7 is removed. A portion of the photo-sensitive material X7 may be removed by, for example and not limited to, an etching operation. A portion of the seed layer S5 is exposed. An RDL layer R3 is formed on the seed layer S5. The RDL R3 may be formed by a plating operation or any suitable operation.

Referring to FIG. 2CC, the photo-sensitive material X7 is removed. A portion of the seed layer S5 is exposed. The exposed portion of the seed layer S5 is removed by, for example and not limited to, an etching operation.

Referring to FIG. 2DD, a semiconductor device 500 is bonded to the RDL R3. The semiconductor device 500 may be bonded to the RDL R3 by a conductive material C3. The semiconductor device 500 may be bonded to the RDL R3 by, for example and not limited to, a flip-chip bonding operation.

Referring to FIG. 2EE, a protection layer 700 is formed on the dielectric layer 820. The protection layer 700 is formed on the RDL R3. The protection layer 700 may be formed by a lamination operation. The protection layer 700 may be formed by a molding operation. The protection layer 700 may include a PA layer. The protection layer 700 may include a molding compound.

Referring to FIG. 2FF, a singulation operation is performed to produce a semiconductor device package similar to or same as the semiconductor device package 10 shown in FIG. 1A.

FIG. 3A, FIG. 3B, FIG. 3C, FIG. 3D, FIG. 3E and FIG. 3F show operations of manufacturing a semiconductor device in accordance with some embodiments of the subject application.

Figure 3A:
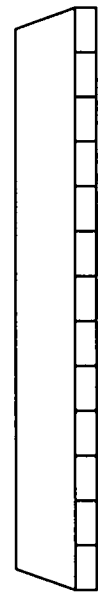
FIG. 3A, FIG. 3B, FIG. 3C, FIG. 3D, FIG. 3E and FIG. 3F show operations of manufacturing a semiconductor device combination in accordance with some embodiments of the subject application.

Referring to FIG. 3A, a strip, panel or matrix of semiconductor devices 300 is provided. FIG. 3A shows one semiconductor device 300, however, it is contemplated that other semiconductor devices 300 are omitted for the sake of simplicity. A dielectric layer 300D is formed on the semiconductor device 300.

Figure 3B:

Referring to FIG. 3B, a conductive material 300C is formed in the dielectric layer 300D to form an RDL 300R.

Figure 3C:
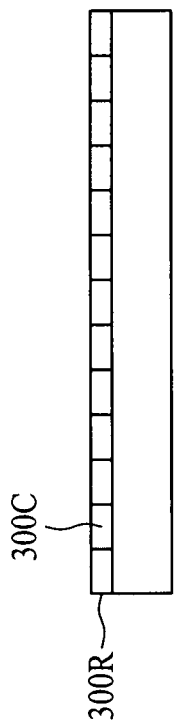

Referring to FIG. 3C, a sidewall 300s of the semiconductor device 300 is formed. The sidewall 300s is inclined or slanted with respect to a surface 3002 of the semiconductor device 300. The sidewall 300s has a slope with respect to the surface 3002 of the semiconductor device 300. The sidewall 300s may be formed by, for example and not limited to, a wet etching operation.

Figure 3D:
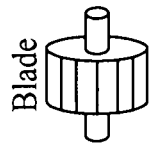

Referring to FIG. 3D, a singulation operation is performed to produce a singulated semiconductor device 300.

Figure 3E:
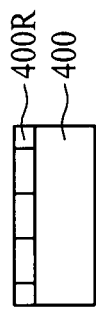

Referring to FIG. 3E, a semiconductor device 400 is provided. An RDL 400R is formed on the semiconductor device 400. The semiconductor device 400 may be produced by similar operations as for the semiconductor device 300, except that the semiconductor device 400 may not have an inclined or slanted sidewall.

Figure 3F:
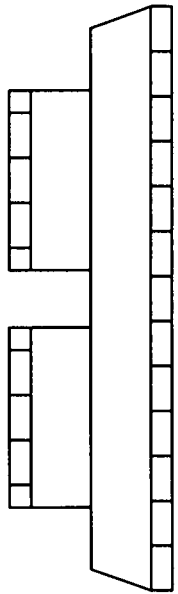

Referring to FIG. 3F, the semiconductor device 400 and the semiconductor device 300 are bonded to form a stack structure or a semiconductor device combo similar to or same as the stack structure CB shown in FIG. 2K.

Figure 4B:
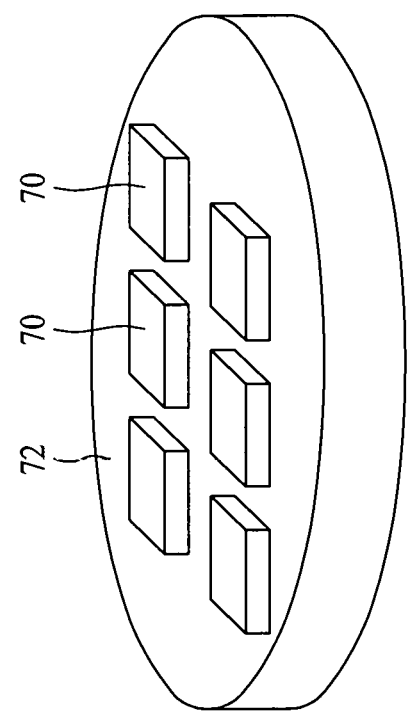
FIG. 4A and FIG. 4B illustrate various types of semiconductor device packages in accordance with some embodiments of the subject application.
Figure 4A:
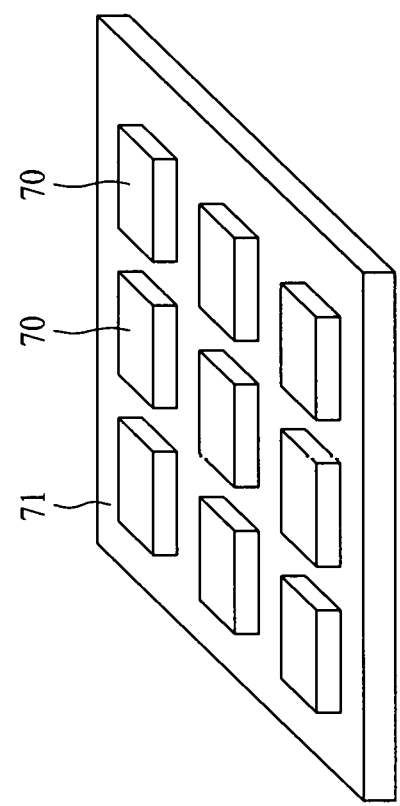

FIGS. 4A and 4B illustrate various types of semiconductor device packages in accordance with some embodiments of the subject application. The semiconductor device packages may be bonded with each other or may be bonded with an external device.

As shown in FIG. 4A, a plurality of chips, dies or semiconductor device packages 70 are placed on a square-shaped carrier 71. In some embodiments, the carrier 71 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof), or a combination of two or more thereof.

As shown in FIG. 4B, a plurality of chips, dies or semiconductor device packages 70 are placed on a circle-shaped carrier 72. In some embodiments, the carrier 72 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof), or a combination of two or more thereof.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µM. A surface can be deemed to be planar or substantially planar if a difference between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the subject application has been described and illustrated with reference to specific embodiments thereof, these descriptions and illustrations do not limit the subject application. It can be clearly understood by those skilled in the art that various changes may be made, and equivalent components may be substituted within the embodiments, without departing from the true spirit and scope of the subject application as defined by the appended claims. The illustrations may not necessarily be drawn to scale. There may be distinctions between the artistic renditions in the subject application and the actual apparatus, due to variables in manufacturing processes and such. There may be other embodiments of the subject application which are not specifically illustrated. The specification and drawings are to be regarded as illustrative rather than restrictive. Modifications may be made to adapt a particular situation, material, composition of matter, method, or process to the objective, spirit and scope of the subject application. All such modifications are intended to be within the scope of the claims appended hereto. While the methods disclosed herein have been described with reference to particular operations performed in a particular order, it can be understood that these operations may be combined, sub-divided or re-ordered to form an equivalent method without departing from the teachings of the subject application. Therefore, unless specifically indicated herein, the order and grouping of the operations are not limitations of the subject application.

What is claimed is:

1. A semiconductor device package, comprising:
    an interposer having a sidewall defining a space;
    a first semiconductor device disposed within the space and in contact with the sidewall; and
    a second semiconductor device disposed within the space and on the first semiconductor device.

2. The semiconductor device package of claim 1, wherein an angle defined by the sidewall of the interposer and a first surface of the interposer is greater than 90°.

3. The semiconductor device package of claim 1, wherein the first semiconductor device has a sidewall in contact with the sidewall of the interposer, and an angle defined by the sidewall of the first semiconductor device and a first surface of the first semiconductor device is greater than 90°.

4. The semiconductor device package of claim 2, wherein the first semiconductor device has a sidewall in contact with the sidewall of the interposer, and an angle defined by the sidewall of the first semiconductor device and a first surface of the first semiconductor device is substantially the same as the angle defined by the sidewall of the interposer and the first surface of the interposer.

5. The semiconductor device package of claim 3, wherein the sidewall of the first semiconductor device is substantially in parallel to the sidewall of the interposer.

6. The semiconductor device package of claim 1, further comprising a redistribution layer (RDL) disposed on a first surface of the interposer and electrically connected to the first semiconductor device.

7. The semiconductor device package of claim 1, wherein the space comprises a through hole of the interposer.

8. The semiconductor device package of claim 1, wherein a thickness of the interposer is equal to or greater than a sum of a thickness of the first semiconductor device and a thickness of the second semiconductor device.

9. The semiconductor device package of claim 1, wherein an area of the first semiconductor device is greater than an area of the second semiconductor device.

10. The semiconductor device package of claim 1, wherein a back surface of the first semiconductor device is adjacent to a back surface of the second semiconductor device.

11. The semiconductor device package of claim 1, further comprising a first redistribution layer (RDL) disposed within the space and on the first semiconductor device and a second RDL disposed within the space and on the second semiconductor device.

12. The semiconductor device package of claim 1, further comprising:
    a first redistribution layer (RDL) disposed on a first surface of the interposer and electrically connected to the first semiconductor device; and
    a second RDL disposed on a second surface of the interposer and electrically connected to the second semiconductor device, wherein the second surface is opposite the first surface.

13. The semiconductor device package of claim 1, wherein the space has a first width and a second width greater than the first width.

14. The semiconductor device package of claim 1, further comprising a redistribution layer (RDL) disposed within the space and on the first semiconductor device.

15. The semiconductor device package of claim 1, wherein the sidewall of the interposer comprises an isolation layer in contact with the first semiconductor device.

16. The semiconductor device package of claim 2, wherein the first surface of the interposer has a {1,1,0} crystal orientation.

17. The semiconductor device package of claim 2, wherein the first surface of the interposer has a {1,1,1} crystal orientation.

18. The semiconductor device package of claim 2, wherein the interposer has a second surface opposite to the first surface, and the first surface and the second surface of the interposer have the same crystal orientation.

19. The semiconductor device package of claim 3, wherein the sidewall of the first semiconductor device is engaged with the sidewall of the interposer.

\* \* \* \* \*